US012710144B2

(12) United States Patent
Bocock et al.

(10) Patent No.: US 12,710,144 B2
(45) Date of Patent: Aug. 18, 2026

(54) SINGLE-LAYER PRINTED CIRCUIT BOARD FOR A LIGHTING DEVICE

(71) Applicant: Lutron Technology Company LLC, Coopersburg, PA (US)

(72) Inventors: Ryan M. Bocock, Austin, TX (US); Ananthanag Nemmani, Austin, TX (US); Peter W. Ogden, Jr., Austin, TX (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 19/067,477

(22) Filed: Feb. 28, 2025

(65) Prior Publication Data

US 2025/0271110 A1 Aug. 28, 2025

Related U.S. Application Data

(60) Provisional application No. 63/642,726, filed on May 4, 2024, provisional application No. 63/642,439, filed (Continued)

(51) Int. Cl.
*F21K 9/238* (2016.01)
*F21K 9/20* (2016.01)
(Continued)

(52) U.S. Cl.
CPC ................ *F21K 9/238* (2016.08); *F21K 9/20* (2016.08); *F21K 9/232* (2016.08); *F21K 9/66* (2016.08); *F21V 7/041* (2013.01); *F21V 19/0025* (2013.01); *F21V 23/005* (2013.01); *F21V 23/06* (2013.01); *H05B 47/19* (2020.01); *H05K 1/0219* (2013.01); *H05K 1/0274* (2013.01);
(Continued)

(58) Field of Classification Search
CPC ...... F21K 9/238; H05B 47/19; H05K 1/0219; H05K 1/0274; H10H 29/24; F21V 23/045; F21V 23/005
See application file for complete search history.

(56) References Cited

U.S. PATENT DOCUMENTS 6,528,954 B1 3/2003 Lys et al.
8,339,029 B2 12/2012 Kim et al.
(Continued)

*Primary Examiner* — William N Harris
(74) *Attorney, Agent, or Firm* — Flaster Greenberg P.C.

(57) ABSTRACT

A printed circuit board (PCB) assembly may include a PCB comprising a base layer, an electrical layout layer, and a dielectric located between the base layer and the electrical layout layer. The electrical layout layer may include a plurality of electrical pads and a plurality of electrical traces. The PCB assembly may include an emitter assembly comprising a plurality of emitters configured to emit light. The plurality of emitters may be mounted to the PCB and electrically connected to the electrical pads via respective wind bonds. The PCB assembly may include drive circuitry configured to control power delivered to the plurality of emitters. The drive circuitry may be mounted to the PCB and electrically connected to the electrical pads via respective solder connections. The PCB assembly may include communication circuitry configured to cause the drive circuitry to control the emitters in response to messages received via wireless signals.

29 Claims, 10 Drawing Sheets

Related U.S. Application Data on May 3, 2024, provisional application No. 63/559,085, filed on Feb. 28, 2024.

(51) Int. Cl.

| | |
|---|---|
| ***F21K 9/232*** | (2016.01) |
| ***F21K 9/66*** | (2016.01) |
| ***F21V 7/04*** | (2006.01) |
| ***F21V 19/00*** | (2006.01) |
| ***F21V 23/00*** | (2015.01) |
| ***F21V 23/04*** | (2006.01) |
| ***F21V 23/06*** | (2006.01) |
| ***F21Y 105/16*** | (2016.01) |
| ***F21Y 115/10*** | (2016.01) |
| ***H05B 47/19*** | (2020.01) |
| ***H05K 1/02*** | (2006.01) |
| ***H05K 1/05*** | (2006.01) |
| ***H05K 1/14*** | (2006.01) |
| ***H05K 1/181*** | (2026.01) |
| ***H05K 3/00*** | (2006.01) |
| ***H05K 3/341*** | (2026.01) |
| ***H10H 29/24*** | (2026.01) |
| ***H10H 29/85*** | (2025.01) |
| *F21Y 105/10* | (2016.01) |

(52) U.S. Cl.

CPC ............. *H05K 1/181* (2013.01); *H10H 29/24* (2025.01); *H10H 29/8508* (2025.01); *H10H 29/857* (2025.01); *F21V 23/045* (2013.01); *F21Y 2105/10* (2016.08); *F21Y 2105/16* (2016.08); *F21Y 2115/10* (2016.08); *H05K 1/056* (2013.01); *H05K 1/142* (2013.01); *H05K 3/0061* (2013.01); *H05K 3/3421* (2013.01); *H05K 2201/0108* (2013.01); *H05K 2201/09027* (2013.01); *H05K 2201/09618* (2013.01); *H05K 2201/09909* (2013.01); *H05K 2201/10098* (2013.01); *H05K 2201/10106* (2013.01); *H05K 2201/10151* (2013.01); *H05K 2203/1316* (2013.01); *H05K 2203/1327* (2013.01)

(56) References Cited

U.S. PATENT DOCUMENTS

| | | | | |
|---|---|---|---|---|
| 8,858,032 | B2 | 10/2014 | Van De Ven et al. | |
| 9,184,497 | B2 * | 11/2015 | Chen | H01Q 3/36 |
| 9,297,501 | B2 | 3/2016 | Chou et al. | |
| 9,538,590 | B2 | 1/2017 | Hussell et al. | |
| 9,538,623 | B2 | 1/2017 | Lee et al. | |
| 9,562,677 | B2 | 2/2017 | Negley et al. | |
| 9,664,370 | B2 * | 5/2017 | Van Der Merwe | F21V 23/0435 |
| 9,777,915 | B2 | 10/2017 | Johnson | |
| 9,810,414 | B2 | 11/2017 | Kim | |
| 10,047,912 | B2 | 8/2018 | Bosua et al. | |
| 10,125,960 | B2 | 11/2018 | Klafta et al. | |
| 10,161,786 | B2 | 12/2018 | Chang et al. | |
| 10,935,228 | B2 | 3/2021 | Bocock et al. | |
| 11,612,029 | B2 | 3/2023 | Harte et al. | |
| 2016/0227636 | A1 * | 8/2016 | Sun | H05B 45/30 |
| 2019/0338895 | A1 * | 11/2019 | Jeswani | F21V 23/04 |
| 2020/0096187 | A1 | 3/2020 | Ter Weeme et al. | |
| 2020/0146119 | A1 | 5/2020 | Li | |
| 2022/0030685 | A1 * | 1/2022 | Li | H05B 45/325 |
| 2024/0369198 | A1 | 11/2024 | Ogden, Jr. | |
| 2025/0320984 | A1 | 10/2025 | Komancsik | |

* cited by examiner

SINGLE-LAYER PRINTED CIRCUIT BOARD FOR A LIGHTING DEVICE

CROSS-REFERENCE TO RELATED APPLICATIONS

This application claims priority from Provisional U.S. Patent Application No. 63/559,085, filed Feb. 28, 2024, Provisional U.S. Patent Application No. 63/642,439, filed May 3, 2024, and Provisional U.S. Patent Application No. 63/642,726, filed May 4, 2024, the entire disclosures of which are hereby incorporated by reference herein in their entirety.

BACKGROUND

Lamps and displays using efficient light sources, such as light-emitting diodes (LED) light sources, for illumination are becoming increasingly popular in many different markets. LED light sources provide a number of advantages over traditional light sources, such as incandescent and fluorescent lamps. For example, LED light sources may have a lower power consumption and a longer lifetime than traditional light sources. In addition, the LED light sources may have no hazardous materials, and may provide additional specific advantages for different applications. When used for general illumination, LED light sources provide the opportunity to adjust the color (e.g., from white, to blue, to green, etc.) or the color temperature (e.g., from warm white to cool white) of the light emitted from the LED light sources to produce different lighting effects.

SUMMARY

As described herein, a printed circuit board assembly may comprise an emitter assembly and drive circuitry for the emitter assembly both mounted to a printed circuit board (e.g., a single printed circuit board). The printed circuit board may have a base layer, an electrical layout layer, and a dielectric located between the base layer and the electrical layout layer, where the electrical layout layer may include a plurality of electrical pads and a plurality of electrical traces. The emitter assembly may include a plurality of emitters configured to emit light, and electrically connected to two or more of the plurality of electrical pads via respective wind bonds. The drive circuitry may be configured to control power delivered to the plurality of emitters of the emitter assembly, and may be electrically connected to two or more of the plurality of electrical pads via respective solder connections. The printed circuit board assembly may also comprise communication circuitry configured to transmit and receive wireless signals. The communication circuitry may be configured to cause the drive circuitry to control the emitters in response to messages received via the wireless signals.

A printed circuit board assembly may include a metal-core printed circuit board. The metal-core printed circuit board may include a base layer, a single electrical layout layer, and/or a single dielectric layer located between the base layer and the electrical layout layer. The electrical layout layer may include a plurality of electrical pads, a plurality of electrical traces, and/or a ground plane. The printed circuit board assembly may include an emitter assembly. The emitter assembly may include a plurality of emitters configured to emit light. The plurality of emitters may be mounted to the printed circuit board and electrically connected to two or more of the plurality of electrical pads.

The printed circuit board assembly may include drive circuitry configured to control power delivered to the plurality of emitters of the emitter assembly. The drive circuitry may be mounted to the printed circuit board and electrically connected to the two or more of the plurality of electrical pads. The printed circuit board assembly may include communication circuitry configured to transmit and receive wireless signals. The communication circuitry may include a circuit common electrically coupled to the ground plane of the printed circuit board. The communication circuitry may be configured to cause the drive circuitry to control the emitters in response to messages received via the wireless signals. The communication circuitry may be mounted to the printed circuit board and electrically connected to the two or more of the plurality of electrical pads. The printed circuit board assembly may include an antenna coupled in electrical communication with the communication circuitry, which, for example, may allow the communication circuitry to communicate messages via wireless signals that are transmitted and received by the antenna. The antenna may extend from the printed circuit board (e.g., extend into a plane outside of a plane defined by the printed circuit board). The communication circuitry may include a matching network circuit coupled between the communication circuitry and the antenna. The matching network circuit may be at least partially surrounded by the ground plane on the electrical layout layer, and the ground plane may be electrically coupled to the base layer of the printed circuit board.

The plurality of emitters may be electrically connected to the two or more of the plurality of electrical pads via respective wind bonds. The drive circuitry and the communication circuitry may be electrically connected to the two or more of the plurality of electrical pads via respective solder connections. The emitters of the emitter assembly may be encapsulated by an optical element. The optical element may include a first dome portion formed on the printed circuit board and encapsulating the one or more emitters. The first dome portion may be made of a first material that is optically transmissive. The first dome portion may define an interface surface that is substantially parallel to and extends above the printed circuit board. The optical element may include a second dome portion located above the first dome portion, such that the first dome portion is located between the second dome portion and the printed circuit board. The second dome portion may have a shape configured to direct light from the one or more emitters in a particular direction. The second dome portion may be made of a second material that is optically transmissive. The second dome portion may define an interface surface that is adhered to the interface surface of the first dome portion.

The optical element may include a barrier located on the surface of the substrate. The barrier may surround the emitters. The barrier and the surface of the substrate may define a recess in which the first dome portion is located. The optical element may include a dome through which the emitters are configured to emit light. The antenna may be a monopole antenna. The printed circuit board assembly may include an antenna connector mounted to the printed circuit board, such that the monopole antenna is electrically connected to the antenna connector, and the monopole antenna extends from the printed circuit board. The printed circuit board assembly may include a through-hole extending through the printed circuit board. The monopole antenna may be electrically connected to the through-hole, such that the monopole antenna may extend from the printed circuit board.

The printed circuit board may include at least one opening that extends through the printed circuit board and that is configured to receive a fastener. The ground plane on the electrical layout layer may be electrically coupled to the base layer of the printed circuit board through the fastener. The fastener may include at least one of a screw or a rivet.

The printed circuit board may include one or more vias located within the ground plane. Each of the vias may extend from the electrical layout layer, through the dielectric layer, and into the base layer. Each of the vias may be filled with an electrically-conductive material for electrically connecting the ground plane on electrical layout layer to the base layer.

A lighting device assembly may include a printed circuit board assembly that includes a metal-core printed circuit board. The metal-core printed circuit board may include a base layer, a single electrical layout layer, and a single dielectric layer located between the base layer and the electrical layout layer. The electrical layout layer may include a plurality of electrical pads, a plurality of electrical traces, and a ground plane. The printed circuit board assembly may include an emitter assembly that includes a plurality of emitters configured to emit light. The plurality of emitters may be mounted to the printed circuit board and electrically connected to two or more of the plurality of electrical pads. The printed circuit board assembly may include drive circuitry configured to control power delivered to the plurality of emitters of the emitter assembly. The drive circuitry may be mounted to the printed circuit board and electrically connected to the two or more of the plurality of electrical pads. The printed circuit board assembly may include communication circuitry configured to transmit and receive wireless signals. The communication circuitry may be configured to cause the drive circuitry to control the emitters in response to messages received via the wireless signals. The communication circuitry may be mounted to the printed circuit board and electrically connected to the two or more of the plurality of electrical pads. The communication circuitry may have a circuit common electrically coupled to the ground plane of the printed circuit board. The lighting device assembly may include a reflector that has a first opening, a second opening, and an inner surface that is reflective. The plurality of emitters may be configured to emit light through the first opening of the reflector. The inner surface of the reflector may be configured to reflect the light through the second opening of the reflector. The printed circuit board assembly may include an antenna coupled in electrical communication with the communication circuitry for allowing the communication circuitry to communicate messages via wireless signals that are transmitted and received by the antenna. The antenna may extend from the printed circuit board external to the reflector.

The antenna may be a monopole antenna. The lighting device assembly may include an antenna holder for holding the monopole antenna such that the monopole antenna may extend from the printed circuit board external to the reflector. The lighting device assembly may include a socket to which the reflector is attached. The antenna holder may be connected the socket and extend from the socket external to the reflector. The antenna holder may be connected to the printed circuit board of the printed circuit board assembly. The lighting device assembly may include an antenna connector mounted to the printed circuit board. In such examples, the monopole antenna may be electrically connected to the antenna connector, such that the monopole antenna may extend from the printed circuit board external to the reflector. The lighting device assembly may include a through-hole extending through the printed circuit board. In such examples, the monopole antenna may be electrically connected to the through-hole, such that the monopole antenna may extend from the printed circuit board external to the reflector.

The ground plane may be electrically coupled to the base layer of the printed circuit board of the printed circuit board assembly. The printed circuit board of the printed circuit board assembly may include at least one opening that extends through the printed circuit board and is configured to receive a fastener. The ground plane on the electrical layout layer may be electrically coupled to the base layer of the printed circuit board through the fastener. The fastener may include at least one of a screw or a rivet. The printed circuit board of the printed circuit board assembly may include one or more vias located within the ground plane, each of the vias extending from the electrical layout layer, through the dielectric layer, and into the base layer. Each of the vias may be filled with an electrically-conductive material for electrically connecting the ground plane on electrical layout layer to the base layer. The communication circuitry of the printed circuit board assembly may include a matching network circuit coupled between the communication circuitry and the antenna. The matching network circuit may be at least partially surrounded by the ground plane on the electrical layout layer.

The plurality of emitters of the emitter assembly may be electrically connected to the two or more of the plurality of electrical pads of the printed circuit board via respective wind bonds. The drive circuitry and the communication circuitry may be electrically connected to the two or more of the plurality of electrical pads of the printed circuit board via respective solder connections. The emitters of the emitter assembly may be encapsulated by an optical element. The optical element of the emitter assembly of the printed circuit board assembly may include a first dome portion formed on the printed circuit board and encapsulating the one or more emitters. The first dome portion may be made of a first material that is optically transmissive. The first dome portion may define an interface surface that is substantially parallel to and extends above the printed circuit board. The optical element may include a second dome portion located above the first dome portion, such that the first dome portion is located between the second dome portion and the printed circuit board. The second dome portion may have a shape configured to direct light from the one or more emitters in a particular direction. The second dome portion may be made of a second material that is optically transmissive and/or define an interface surface that is adhered to the interface surface of the first dome portion. The optical element may include a barrier located on the surface of the substrate and surrounding the one or more emitters. The barrier and the surface of the substrate may define a recess in which the first dome portion is located. The optical element may include a dome through which the emitters are configured to emit light.

A printed circuit board assembly may include a printed circuit board comprising a base layer, an electrical layout layer, and a dielectric located between the base layer and the electrical layout layer. The electrical layout layer may include a plurality of electrical pads and a plurality of electrical traces. The printed circuit board assembly may include an emitter assembly comprising a plurality of emitters configured to emit light. The plurality of emitters may be mounted to the printed circuit board and electrically connected to two or more of the plurality of electrical pads via respective wind bonds. The printed circuit board assembly may include drive circuitry configured to control power delivered to the plurality of emitters of the emitter assembly. The drive circuitry may be mounted to the printed circuit board and electrically connected to two or more of the plurality of electrical pads via respective solder connections. The printed circuit board may include communication circuitry configured to transmit and receive wireless signals. The communication circuitry may be configured to cause the drive circuitry to control the emitters in response to messages received via the wireless signals.

The printed circuit board may be a metal-core printed circuit board. The printed circuit board may include a single electrical layout layer and a single dielectric layer. The communication circuitry may be mounted to the printed circuit board and electrically connected to two or more of the plurality of electrical pads via respective solder connections. The communication circuitry may be electrically coupled to an antenna that extends from the printed circuit board. The communication circuitry may include a processor and a circuit common that is electrically coupled to a ground plane on the electrical layout layer. The antenna may be electrically coupled to the processor via a matching network circuit that is at least partially surrounded by the ground plane on the electrical layout layer. The ground plane on the electrical layout layer may be electrically coupled to the base layer of the printed circuit board. The printed circuit board may include at least one opening that extends through the printed circuit board and is configured to receive a fastener. The ground plane on the electrical layout layer may be electrically coupled to the base layer of the printed circuit board through the fastener. The fastener may include at least one of a screw or a rivet. The printed circuit board may include one or more vias located within the ground plane, each of the vias extending from the electrical layout layer, through the dielectric layer, and into the base layer, each of the vias filled with an electrically-conductive material for electrically connecting the ground plane on electrical layout layer to the base layer. The antenna may include a monopole antenna extending from the printed circuit board.

The emitters of the emitter assembly may be encapsulated by an optical element. The optical element may include a first dome portion formed on the printed circuit board and encapsulating the one or more emitters. The first dome portion may be made of a first material that is optically transmissive. The first dome portion may define an interface surface that is substantially parallel to and extends above the printed circuit board. The optical element may include a second dome portion located above the first dome portion, such that the first dome portion is located between the second dome portion and the printed circuit board. The second dome portion may have a shape configured to direct light from the one or more emitters in a particular direction. The second dome portion may be made of a second material that is optically transmissive and may define an interface surface that is adhered to the interface surface of the first dome portion. The optical element may include a barrier located on the surface of the substrate and surrounding the one or more emitters. The barrier and the surface of the substrate may define a recess in which the first dome portion is located. The optical element may include a dome through which the emitters are configured to emit light.

The printed circuit board may be a first printed circuit board, and the printed circuit board assembly may include a second printed circuit board. The communication circuitry may be mounted to the second printed circuit board and electrically connected to two or more of a plurality of electrical pads of the second printed circuit board via respective solder connections. The first printed circuit board may be a metal-core printed circuit board. The first printed circuit board may include a notch in which the second printed circuit board is located. The communication circuitry may be electrically coupled to an antenna that is located on an electrical layout layer of the second printed circuit board. The communication circuitry may be electrically coupled to an antenna that may be a monopole antenna that extends from the second printed circuit board.

A printed circuit board assembly may include a metal-core printed circuit board. The metal-core printed circuit board may include a base layer, a single electrical layout layer, and a single dielectric layer located between the base layer and the electrical layout layer. The electrical layout layer may include a plurality of electrical pads and a plurality of electrical traces. The printed circuit board assembly may include an emitter assembly that includes a plurality of emitters configured to emit light. The plurality of emitters may be mounted to the printed circuit board and may be electrically connected to two or more of the plurality of electrical pads. The printed circuit board assembly may include drive circuitry configured to control power delivered to the plurality of emitters of the emitter assembly. The drive circuitry may be mounted to the printed circuit board and may be electrically connected to two or more of the plurality of electrical pads. The printed circuit board assembly may include communication circuitry configured to transmit and receive wireless signals. The communication circuitry may be configured to cause the drive circuitry to control the emitters in response to messages received via the wireless signals. The communication circuitry may be mounted to the printed circuit board and may be electrically connected to two or more of the plurality of electrical pads.

DETAILED DESCRIPTION

Figure 1:
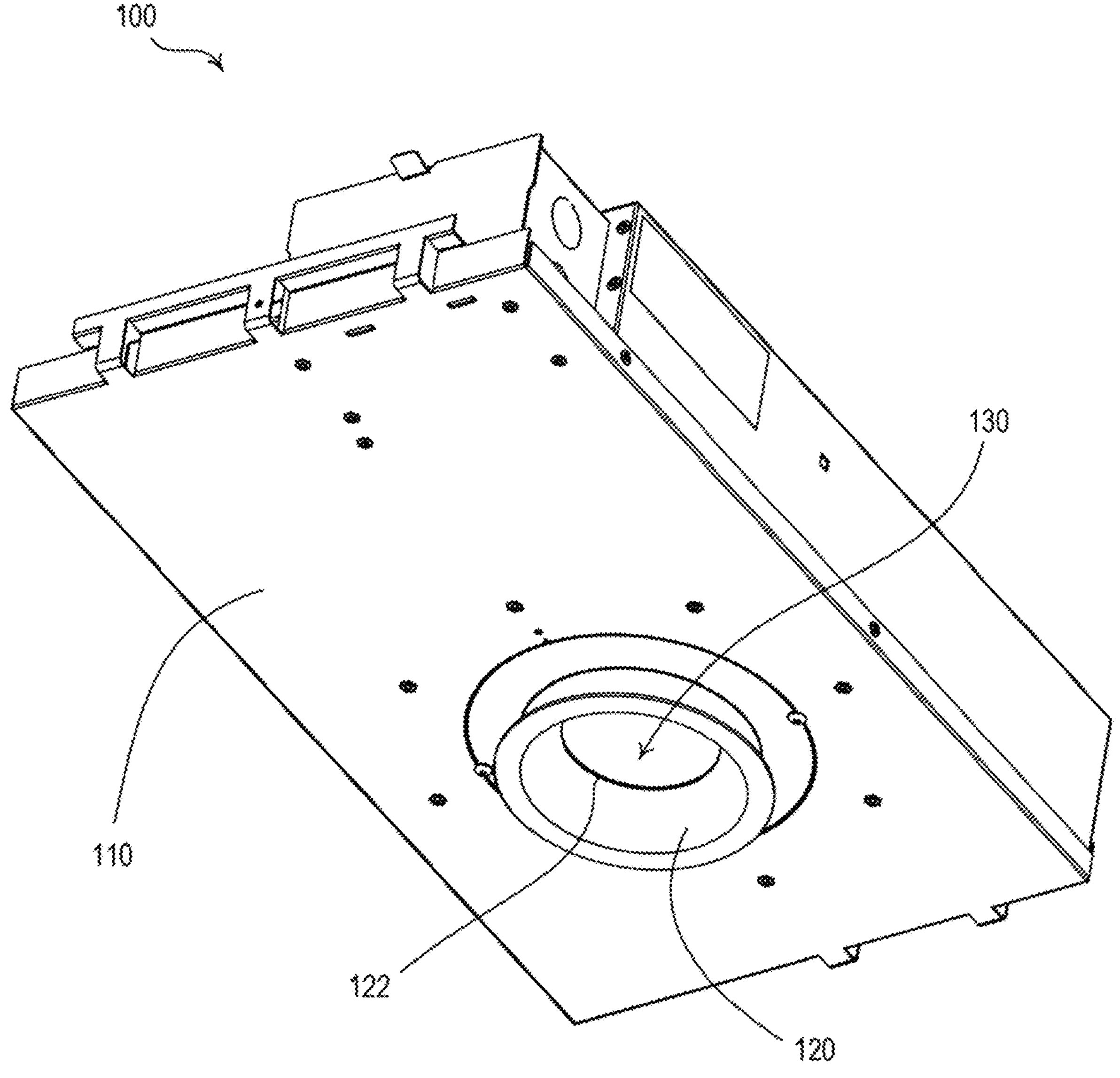
FIG. 1 is a perspective view of an example lighting device.

FIG. 1 is a perspective view of an example illumination device, such as a lighting device 100 (e.g., a downlight fixture). The lighting device 100 may include a housing 110 (e.g., an enclosure), a trim 120, and a lighting device assembly 130. The housing 110 may be configured to enclose the lighting device assembly 130, and at least a portion of the trim 120. The housing 110 may be configured to be installed within a structure (e.g., a ceiling). When the housing 110 is installed within the structure, at least a portion of the trim 120 may extend from the structure (e.g., and visible to a user). The trim 120 may be configured to cover (e.g., hide from view) an opening in the housing 110. The housing 110 may be configured to receive various trims (e.g., such as the trim 120) with varying physical properties. The trim 120 may define an aperture 122 of the lighting device 100 through which the lighting device assembly 130 may be configured to emit light. The aperture 122 of the lighting device 100 may be characterized by an aperture size, which may be, for example, a diameter $D_{APERTURE}$ of the aperture 122 (e.g., approximately 2-3 inches).

Figure 2:
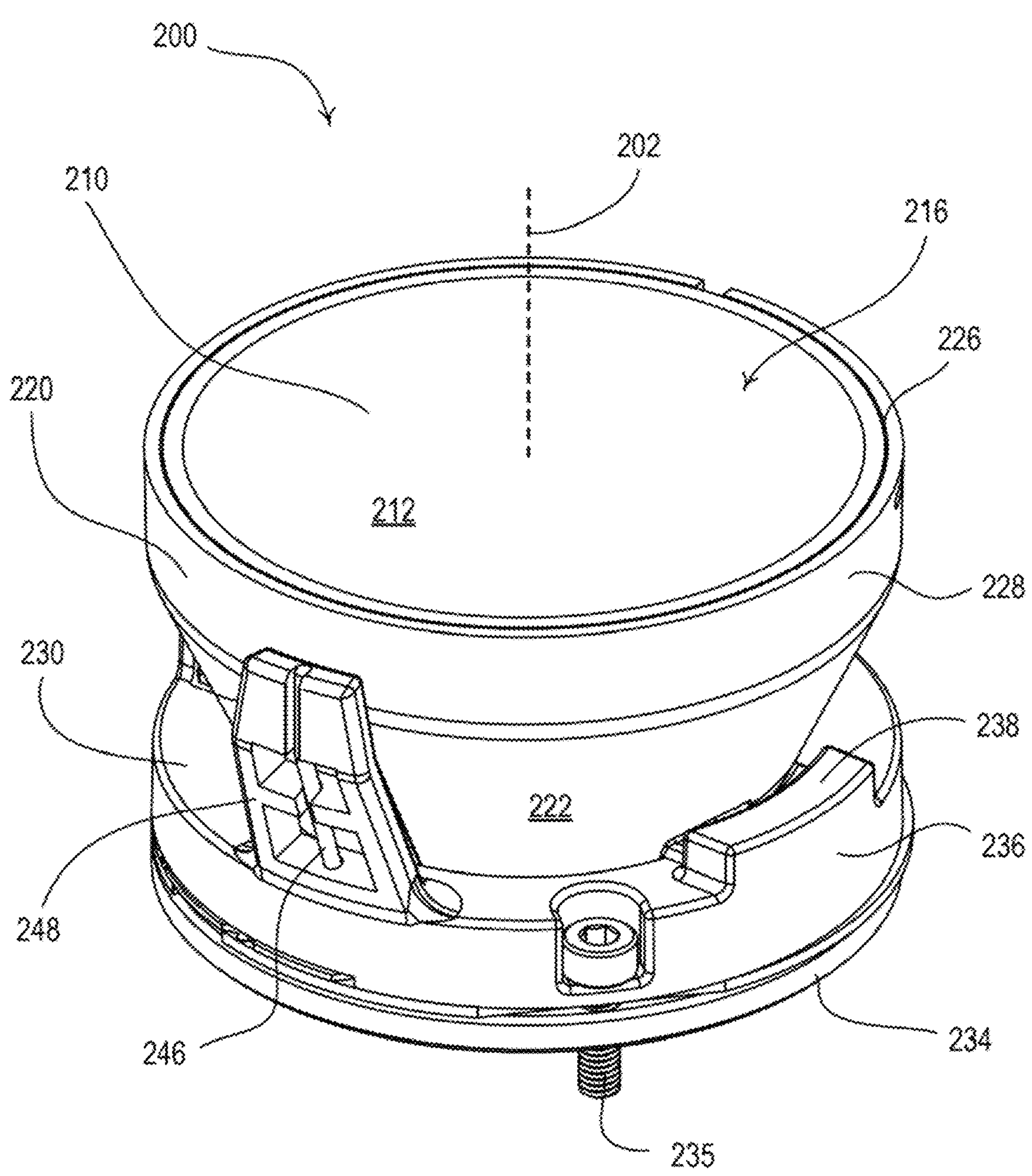
FIG. 2 is a perspective view of an example lighting device assembly, which may be deployed as part of the lighting device shown in FIG. 1.
Figure 3:
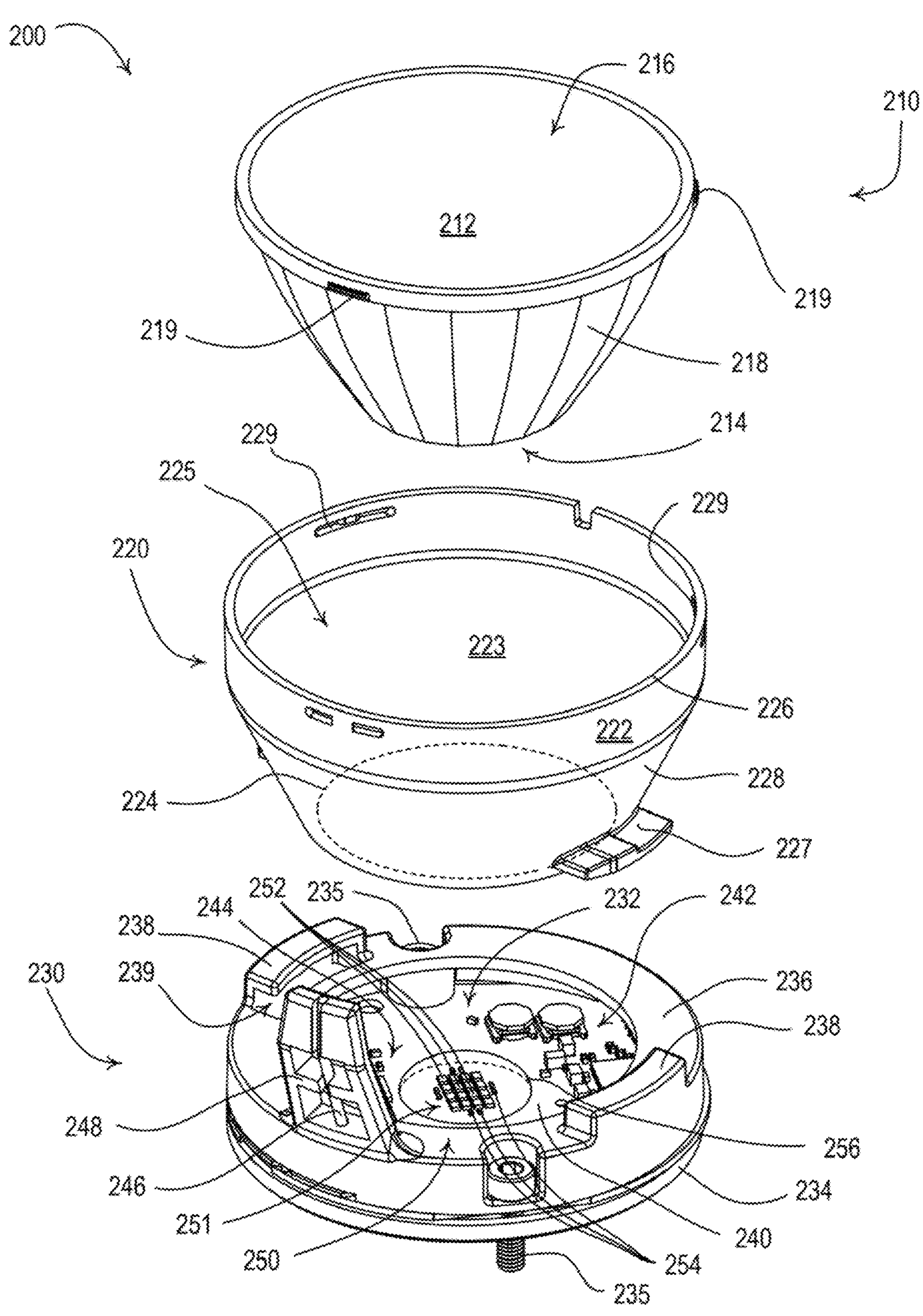
FIG. 3 is an exploded view of the lighting device assembly of FIG. 2.

FIG. 2 is a perspective view of an example lighting device assembly 200 for a lighting device, which may be deployed as the lighting device assembly 130 of the lighting device 100 shown in FIG. 1. FIG. 3 is an exploded view of the lighting device assembly 200. The lighting device assembly 200 may comprise an optical structure 210 (e.g., a lens), a reflector 220, and a light-generation module 230. The light-generation module 230 may comprise a printed circuit board (PCB) assembly 232, a heat sink 234, and a socket 236. The printed circuit board assembly 232 may include a printed circuit board 240 and may be located between the heat sink 234 and the socket 236. The socket 236 may at least partially enclose the printed circuit board assembly 232, such as partially surround an upper surface of the printed circuit board assembly 232. The reflector 220 may be connected (e.g., mounted) to the socket 236. The socket 236 may define two or more connectors 238 that each define a respective slot 239 in which a respective tab 227 of the reflector 220 may be received for connecting the reflector 220 to the light-generation module 230. Accordingly, the reflector 220 may include two or more tabs 227 dispersed on an outer periphery of the reflector. The lighting device assembly 200 may define a central axis 202 about which the optical structure 210 and the reflector 220 may be centered (e.g., substantially centered). The lighting device assembly 200 (e.g., the printed circuit board assembly 232, the heat sink 234, and the socket 236) may be held together (e.g., fastened together) by one or more fasteners 235 (e.g., screws) that extend through the socket 236, the printed circuit board assembly 232, and the heat sink 234. For example, the lighting device assembly 200 may comprise two screws (e.g., as shown in FIG. 3). The fasteners 235 may also be used to mount the lighting device assembly 200 to the lighting device. In some examples, the lighting device assembly 200 may be held together by one or more rivets.

The light-generation module 230 (e.g., the printed circuit board assembly 232) may include an emitter assembly 250 (e.g., an emitter module) having an array 251 of emitters 252, e.g., such as light-emitting diodes (LEDs). The array 251 of the emitters 252 may be centered about (e.g., substantially centered about) the central axis 202 of the lighting device assembly 200. The array 251 of the emitters 252 may have a dimension $d_{ARRAY}$. In some examples, the emitter assembly 250 may also include (e.g., optionally include) one or more detectors 254 (e.g., detection LEDs) located next to or proximate to (e.g., surround) the array 251 of the emitters 252. The emitter assembly 250 may comprise, for example, sixteen emitters 252 and eight detectors 254, although other variations are possible. In some examples, the emitter assembly 250 may include more or less emitters 252 and more or less detectors 254 than shown in FIG. 3 and further shown in FIG. 4. For example, the emitters assembly 250 may comprise a single emitter. In some examples, the detectors 254 may be omitted. In addition, different configurations of the emitters 252 and/or the detectors 254 may be used. The emitters 252 and/or the detectors 254 may be mounted to (e.g., directly mounted to) the printed circuit board 240 of the printed circuit board assembly 232. In some examples, the emitter assembly 250 may include any combination of the array 251 of emitters 252, the printed circuit board 240, the one or more detectors 254, and/or the dome 256.

In some examples, the emitter assembly 250 may include an optical element, such as the dome 256, that is configured to enclose (e.g., encapsulate) the emitters 252 and the detectors 254 mounted to the printed circuit board 240. Although described as a dome, the optical element or dome may be any shape or size. That is, the dome 256 is not limited to any particular shape. The dome 256 may have any of a variety of different shapes, such as a hemispherical shape, a rectangular shape, a square shape, or a non-uniform shape. In some examples, the dome 256 may include multiple portions, and in such examples, each portion of a dome 256 may have the same shape or different shapes. As described herein, the dome 256 may encapsulate, or form a dome over, one or more components of the light-generation module 230. The emitters 252 of the emitter assembly 250 may be configured to emit light (e.g., through the dome 256). In some examples, the dome 256 may be omitted. The emitters 252 of the emitter assembly 250 may be thermally coupled to the heat sink 234 via the printed circuit board 240. The heat sink 234 may be configured to dissipate heat generated by the emitters of the emitter assembly 250.

The optical structure 210 may comprise a body 212 having a light-entry portion 214, a light-exit portion 216, and a side wall 218. For example, the side wall 218 may define a total internal reflection (TIR) surface (not shown) within the body 212 of the optical structure 210. The side wall 218 may be smooth and/or may be faceted as shown in FIG. 3, although other variations are possible. The reflector 220 may comprise a body 222 (e.g., a conically-shaped body) having a first opening 224 (e.g., which is illustrated as a dashed line in FIG. 3), a second opening 226, and a side wall 228 that extends between the first opening 224 and the second opening 226. The body 222 of the reflector 220 may define a cavity 225 (FIG. 3) in which the optical structure 210 may be received (e.g., as shown in FIG. 2). The reflector 220 may have an inner surface 223 that may be reflective. The optical structure 210 may comprise tabs 219 configured to be received in corresponding recesses 229 formed in the reflector 220 for holding the optical structure 210 within the cavity 225 of the reflector 220. For example, the reflector 220 may include one or more recesses 229 defined in the body 222, and the optical structure 210 may include one or more tabs 219 located on the outside of the housing of the optical structure 210.

When the lighting device assembly 200 is assembled (e.g., as shown in FIG. 2), the emitters 252 of the emitter assembly 250 may be configured to emit light through the dome 256 and the first opening 224 of the reflector 220, and onto the light-entry portion 214 of the optical structure 210. The optical structure 210 may be configured to conduct or direct the light received by the light-entry portion 214 towards the light-exit portion 216, such that the light may shine through the second opening 226 of the reflector 220. For example, the light-exit portion 216 of the optical structure 210 may be circular to match a circular shape of the second opening 226 of the reflector 220. The TIR surface defined by the side wall 218 of the optical structure 210 may be configured to reflect light towards the light-exit portion 216. In addition, the inner surface 223 of the reflector 220 may be configured to reflect the light towards the light-exit portion 216 of the optical structure 210.

The printed circuit board assembly 232 may comprise drive circuitry 242 that may be mounted to the printed circuit board 240 and may control the amount of power delivered to the emitters 252 of the emitter assembly 250. For example, the drive circuitry 242 mounted to the printed circuit board 240 may include a plurality of electrical components, such as one or more drive circuits for controlling the emitters 252, and one or more control circuits for controlling the drive circuits. The drive circuitry 242 (e.g., the one or more control circuits) may be configured to control the emitters 252 of the emitter assembly 250 and to thus adjust an intensity level and/or a color of a cumulative light emitted by the light-generation module 230. For example, the drive circuitry 242 may be configured to control the emitters 252 to adjust the intensity level of the cumulative light emitted by the light-generation module 230 between a high-end intensity level (e.g., a maximum intensity level, such as approximately 100%) and a low-end intensity level (e.g., a minimum intensity level, such as approximately 0.1%-1.0%). In addition, the drive circuitry 242 may be configured to control the emitters 252 to adjust a present color temperature (e.g., a correlated color temperature (CCT) of the cumulative light emitted by the light-generation module 230. Further, the drive circuitry 242 may be configured to control the emitters 252 to adjust a present color value (e.g., which may be defined by a present x-chromaticity coordinate $X_{PRES}$ and a present y-chromaticity coordinate) of the cumulative light emitted by the light-generation module 230. While the lighting device assembly 200 is described herein with the present color value defined by the present x-chromaticity coordinate and the present y-chromaticity coordinate, the present color value could be defined by other color values (e.g., as defined in other color spaces). For example, the present color value by be a red-green-blue (RGB) color value (e.g., as defined by a red value, a green value, and a blue value, and/or a hex value in the RGB color space) a UVW color value (e.g., as defined by a u-chromaticity value, a v-chromaticity value, and a lightness index (e.g., w) value in the UVW color space), a wavelength, and/or other suitable color value.

The printed circuit board assembly 232 may also comprise communication circuitry 244 for communicating messages via signals, such as wireless signals (e.g., radio-frequency (RF) signals), with devices that are external to lighting device assembly 200. For example, the communication circuitry 244 may include a plurality of electrical components, such as one or more communication circuits for communicating messages via wireless signals, and one or more control circuits for interfacing between the communication circuits and the drive circuitry 242. In one example, the communication circuitry 244 may be mounted to the printed circuit board 240. In another example, the printed circuit board assembly 232 may comprise two printed circuit boards (e.g., rather than one printed circuit board 240), where the emitter assembly 250 (e.g., the emitters 252 and the detectors 254) and the drive circuitry 242 may be mounted to a first one of the printed circuit boards, and the communication circuitry 244 may be mounted to a second one of the printed circuit boards. The communication circuitry 244 may be configured to control the drive circuitry 242 (e.g., directly or indirectly via the one or more control circuits) to control the emitters 252 of the emitter assembly 250 in response to messages received via the wireless signals.

The printed circuit board assembly 232 of the light-generation module 230 may also comprise an antenna 246 that may be electrically coupled to the one or more communication circuits of the communication circuitry 244 mounted to the printed circuit board 240, for example. The one or more communication circuits may be configured to communicate messages in wireless signals with external devices (e.g., that are external to lighting device assembly 200) via the antenna 246. For example, the one or more communication circuits may include a radio-frequency (RF) transceiver coupled to the antenna 246 for transmitting and/or receiving message in RF signals. Alternatively, the one or more communication circuits may include an RF transmitter for transmitting messages in RF signals and/or an RF receiver for receiving messages in RF signals via the antenna 246. The antenna 246 may extend from the printed circuit board 240, for example, to a location that is external to the reflector 220 (e.g., outside of and/or not within the cavity 225). In other words, the antenna 246 may not pass into or through cavity 225 of the reflector 220. The antenna 246 may be held in place by an antenna holder 248, such that the antenna 246 extends from the printed circuit board 240 external to the reflector 220. The antenna holder 248 may be connected to and/or extend from the socket 236. The antenna 246 may extend through the socket 236 and/or the antenna holder 258 such that the antenna 246 is located external to the reflector 220. In some examples, the antenna holder 248 may be connected to the printed circuit board 240.

It is desirable to design a printed circuit board assembly (e.g., that includes an emitter assembly, drive circuitry, and communication circuitry, such as wireless communication circuitry) that can be used in a variety of lighting devices for general purpose lighting, such as lighting devices that are relatively in small size (e.g., track lighting and other lighting devices with small aperture sizes, such as approximately 2 inches in diameter or less), lighting devices that have housings that are approximately the same size as the aperture size (e.g., having a fixture size of approximately 2.5 inches), and/or lighting devices that include mechanisms for tilting and/or rotating the emitter assembly of the printed circuit board assembly to allow light emitted by the emitter assembly to be directed in various directions (e.g., such as the lighting device 100 shown in FIG. 1). The lighting device may be used to provide general purpose lighting (e.g., having a lumen output at least in the range of 1,100-1,800 lumens), and thus the printed circuit board assembly should be capable of supporting a power rating of approximately 30 watts (e.g., at least in the range of 18-28 watts) for powering emitters in the printed circuit board assembly. It is further desirable to provide a lighting device that may provide advanced color control features (e.g., such as warm dimming, white dimming, color temperature (CCT) control, full color control, and/or color tuning) and/or a lighting device that includes emitters of different colors and may be configured to emit light at a high quality (e.g., light characterized by a color that appears uniform and/or mixed as compared to, for example, light characterized by a color that appears pixelated or unmixed). Such features may require the emitters be situated in closed proximity to each other.

When designing a printed circuit board assembly that is configured to be used in a variety of lighting devices while still being configured to provide advanced color control features and/or high quality light output, certain variables (e.g., such as the size of the printed circuit board, heat dissipation of the drive circuitry and LEDs, and interference with communication circuitry (e.g., RF circuitry)) become design constraints. For example, since constraints on the size of the printed circuit board may require the diameter of the printed circuit board to be small, the emitters on the printed circuit board need to be mounted relatively close together (e.g., which is even more true when those emitters are of different colors that need to be mixed to provide advanced color control features and/or high quality light output, as noted above). The use of a printed circuit board that has a number of dielectric layers and electrical layout layers that make up the printed circuit board may lead to heat dissipation issues with the emitters since the dielectric layers can hinder the transfer of heat from the emitters to the heat sink, which need to be close together on a smaller-diameter board to provide advanced color control features and/or high quality (e.g., uniform) light output. Such heat dissipation issues in a lighting device can cause light performance (e.g., color output may change with temperature) and life span of the emitters (e.g., LEDs) may be adversely affected by heat.

According to a lighting device as described herein, to effectively manage heat on the printed circuit board and components of the printed circuit board assembly, the printed circuit board assembly may have a reduced number of dielectric layers. In particular, the printed circuit board described herein minimizes the number of dielectric layers to a single dielectric layer—i.e., the printed circuit board is a single layer board (e.g., having a base layer, a single electrical layout layer, and a single dielectric layer located between the base layer and the electrical layout layer). However, mounting the drive circuitry for the emitters and also the RF circuitry (according to examples described herein) to a small, single-layer printed circuit board can cause issues with interference with the wireless communication circuitry (e.g., the wireless communication circuitry may encounter communication errors). For example, with a single-layer printed circuit board (e.g., with a single dielectric layer), there may be capacitance issues between the contacts on the board (e.g., which may lead to communication errors). Further, a smaller, single-layer board may lead to less room for a ground plane (e.g., lead to a smaller ground plane) (e.g., particularly since there is only a single layer), which may increase communication errors. The printed circuit board as described herein may be structured such that a circuit common of the wireless communication circuitry (e.g., a portion of the circuit common of the wireless communication circuitry near an antenna and a matching network of the wireless communication circuitry) may be coupled to a ground plane on the electrical layout layer. Further the ground plane may be electrically coupled to the base layer of the printed circuit board.

As described herein, the printed circuit board assembly 232 (e.g., in addition to the other printed circuit boards assemblies described herein) provides a solution to the aforementioned issues to provide a printed circuit board assembly that can be used in a variety of lighting devices. In some examples, the printed circuit board 240 of the printed circuit board assembly 232 (e.g., and the other printed circuit board assemblies described herein) may be a single-layer board and is approximately 2 inches in diameter, and the printed circuit board assembly 232 may include emitters, drive circuitry, and communication circuitry. Further, the printed circuit board assembly 232 may be configured to provide at least 1,100-1,800 lumens of light output, may be capable of supporting at least a power rating of 30 watts (e.g., at least in the range of 18-28 watts), and may provide advanced color control features (e.g., such warm dimming, white dimming, color temperature (CCT) control, full color control, and/or color tuning) and/or high quality light output, in addition to other advantages.

Figure 4:
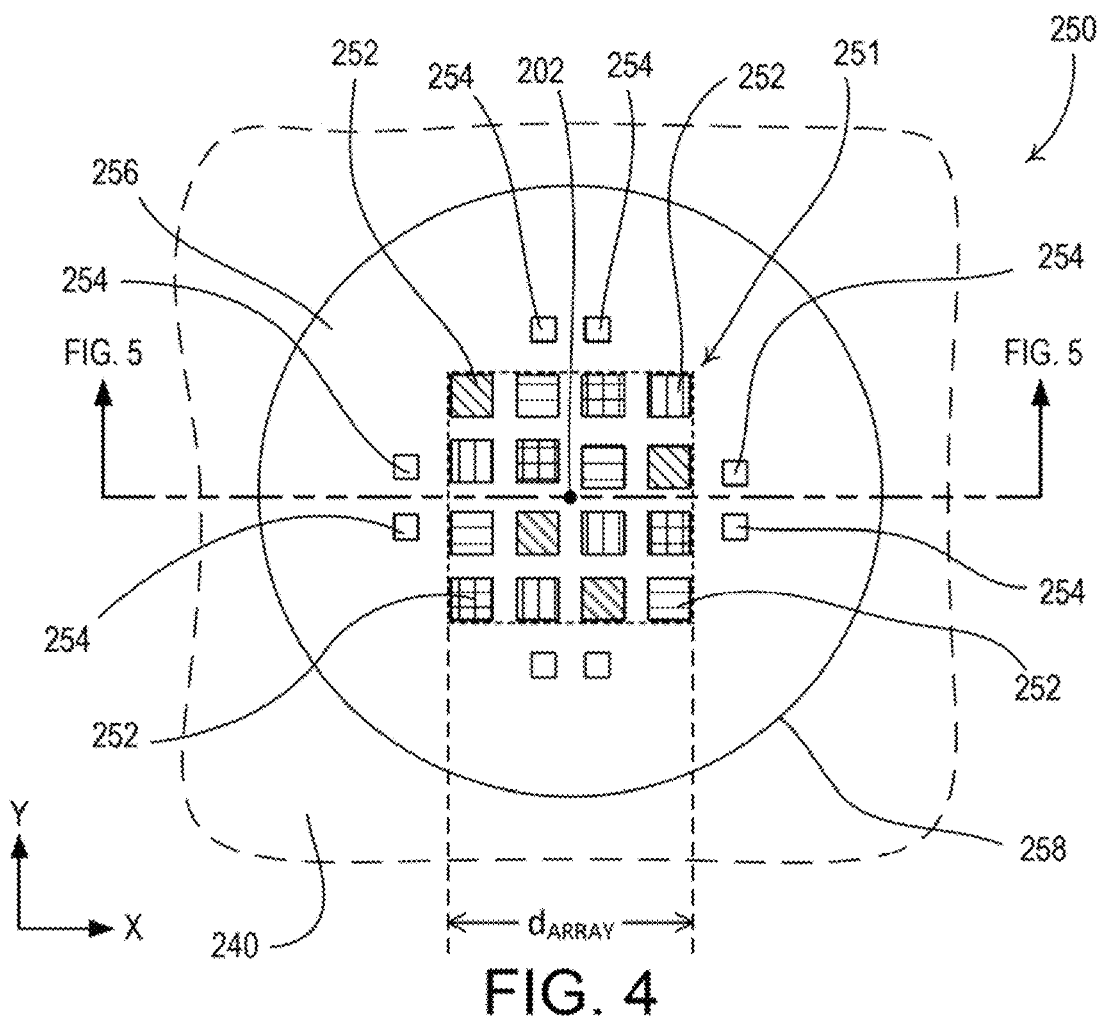
FIG. 4 is a top view of an example emitter assembly of a lighting device assembly, such as the lighting device assembly shown in FIG. 2.
Figure 5:
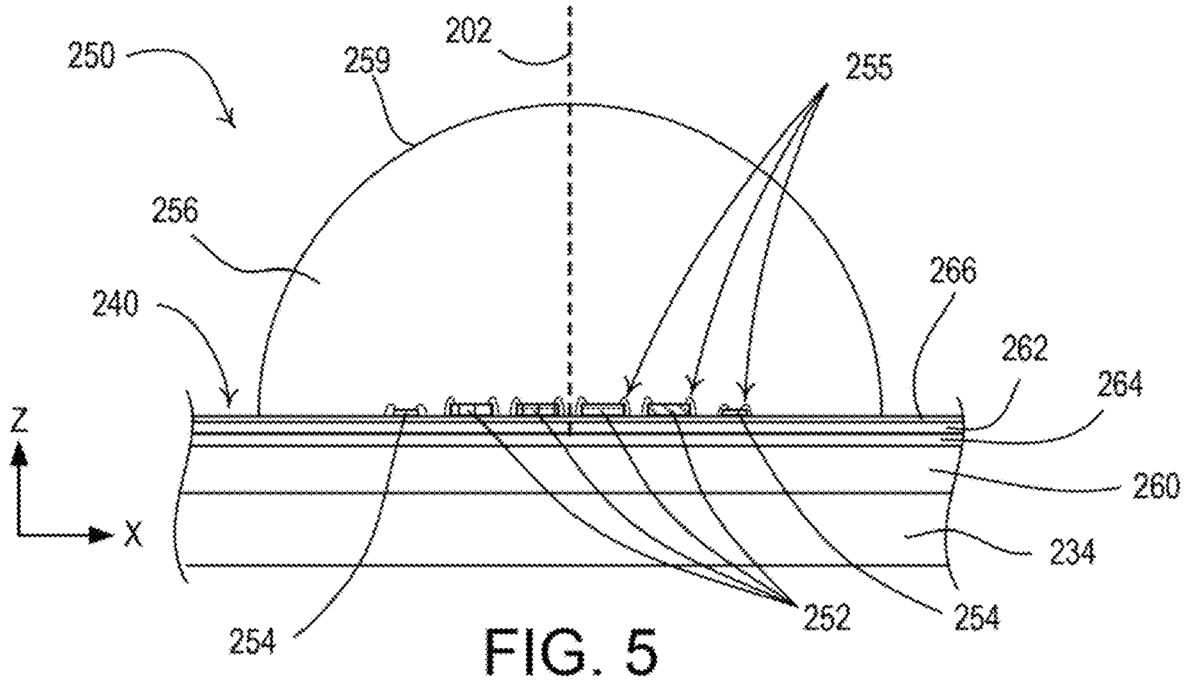
FIG. 5 is a side cross-section view of the emitter assembly of FIG. 4 taken through the center of the emitter assembly.

FIG. 4 is a top view of the emitter assembly 250 mounted to the printed circuit board 240 of the printed circuit board assembly 232. FIG. 5 is a side cross-section view of the emitter assembly 250 taken through the center of the emitter assembly 250 (e.g., through the line shown in FIG. 4). The emitter assembly 250 may include multiple “chains” of the emitters 252 (e.g., series-coupled emitters). The emitters 252 of each chain may be coupled in series and may conduct the same drive current. Each chain may include emitters 252 that produce illumination at the same peak emission wavelength (e.g., emit light of the same color). The emitters 252 of different chains may emit light of different colors. For example, the emitter assembly 250 may comprise three or four differently-colored chains of emitters 252 (e.g., red, green, blue, and white (e.g., substantially white), mint green, and/or yellow). In some examples, the emitter assembly 250 may include a chain of four red emitters, a chain of four green emitters, a chain of four blue emitters, and a chain of four white (e.g., or yellow or mint green) emitters. The individual emitters 252 in each chain may be scattered about the array 251, such as a square array, and arranged so that no color appears twice in any row, column, or diagonal of the array to improve color mixing within the emitter assembly 250. Other variations of numbers of the emitters 252 per chain, the colors of the emitters 252, the numbers of the colors of the emitters 252, the number of chains of the emitters 252, etc., may be used. According to one example, the emitters may be configured to occupy an area of about 18 to 20 mm squared. Patterns other than a square array may be used. Other variations are possible.

The detectors 254 may be located in pairs close to each edge (e.g., or one or more edges) of the array 251 of the emitters 252 (e.g., as shown in FIG. 4) and/or and in the center of the array 251 of the emitters 252. Similar to the emitters 252, the detectors 254 may be LEDs that can be used to emit or receive optical or electrical signals. When the detectors 254 are coupled to receive optical signals and emit electrical signals, the detectors may produce currents indicative of incident light from, for example, an emitter, a plurality of emitters, or a chain of emitters 252. The detectors 254 may be any devices that produce currents indicative of incident light, such as a silicon photodiode or an LED. For example, the detectors 254 may each be an LED having a peak emission wavelength in the range of approximately 550 nm to 700 nm, such that the detectors may not produce photocurrent in response to infrared light (e.g., to reduce interference from ambient light). For example, a first detector of each pair of detectors 254 may comprise a small red, orange, or yellow LED, which may be used to measure a luminous flux of the light emitted by the red LEDs of the emitters 252. A second detector of each pair of detectors 254 may comprise a green LED, which may be used to measure a respective luminous flux of the light emitted by each of the green and blue LEDs of the emitters 252. Both of the first and second detectors 254 may be used to measure the luminous flux of the white LEDs (e.g., or other LEDs, such as a yellow LEDs or light green LEDs or mint green LEDs) of the emitters 252 at different wavelengths (e.g., to characterize the spectrum of the light emitted by the white LEDs). Although described in the context of white LEDs, in some examples the emitters 252 may include LEDs of another color, such as yellow or mint green. Further, in some examples, white LEDs may be phosphor-converted white LEDs. The first detectors of each pair of detectors 254 may be coupled in parallel in the emitter assembly 250. Similarly, the second detectors of each pair of detectors 254 may be coupled in parallel in the emitter assembly 250. Other variations are possible.

The dome 256 may comprise, for example, an optically-transmissive material (e.g., a translucent and/or transparent material), such as silicon or the like, and may be formed through a molding process, for example. The dome 256 may have an outer periphery 258 that surrounds the emitters 252 and the detectors 254 (e.g., as shown in FIG. 4). The dome 256 may be a solid structure comprising the optically-transmissive material filled in between the printed circuit board 240 and an outer surface 259 of the dome 256. The outer surface 259 of the dome 256 may be textured (e.g., lightly textured), for example, to increase light scattering and promote color mixing, as well as to reflect a portion (e.g., a small amount) of the light emitted by the emitters 252 back toward the detectors 254 mounted on the printed circuit board 240, e.g., about 5% (e.g., when the detectors 254 are included). The emitters 252, the detectors 254, the dome 256, and the printed circuit board 240 may form an optical system. The emitters 252 of the array 251 of the emitters may be located as close as possible together to the central axis 202 of the lighting device assembly 200, so as to approximate a centrally-located point source.

The emitters 252 of the emitter assembly 250 may be thermally coupled to the heat sink 234 via the printed circuit board 240. For example, the printed circuit board 240 may comprise a metal-core printed circuit board, which may provide for higher thermal conductivity and lower thermal resistance between the emitters 252 and the heat sink 234 (e.g., as compared to a printed circuit board made from a more standard substrate, such as an FR4 substrate). For instance, a metal-core printed circuit board may be a printed circuit board that has a base layer that is made of metal, such as aluminum, as opposed to an FR4 substrate. For instance, a metal-core printed circuit board may include a base layer that is conductive. As shown in FIG. 5, the printed circuit board 240 may comprise a base layer 260, which may be, for example, a thermally-conductive substrate, such as copper, aluminum, alumina, ceramic, or combinations thereof.

The printed circuit board 240 may have plurality of electrical traces and/or electrical pads formed from a conductive material (e.g., such as copper) on an electrical layout layer 262. The printed circuit board 240 may comprise a dielectric layer 264, which may be a thermally-conductive dielectric (e.g., such as an organic resin with ceramic fillers (e.g., $Al_2O_3$, AlN, BN, etc.)). The dielectric layer 264 may be disposed between the base layer 260 and the electrical layout layer 262 for providing electrical isolation between the base layer 260 and the electrical layout layer 262. The electric layout layer 262 may have disposed thereon a solder mask layer 266, which may cover the electrical traces of the electrical layout layer 262, while leaving the electrical pads of the electrical layout layer 262 exposed (e.g., the electrical layout layer 262 may be located between the solder mask layer 266 and the dielectric layer 264).

While the dielectric layer 264 is somewhat thermally conductive, the presence of the dielectric layer 264 of the printed circuit board 240 may increase the thermal resistance (e.g., decrease the thermal conductivity) between the emitters 252 and the heat sink 234 (e.g., as compared to when no dielectric layer is provided). For example, the thickness of the dielectric layer 264 may be decreased to reduce the thermal resistance between the emitters 252 and the heat sink 234. In addition, to further reduce the thermal resistance between the emitters 252 and the heat sink 234, the printed circuit board 240 may comprise (e.g., only comprise) a single dielectric layer 264 (e.g., on one side of the printed circuit board 240). As a result, the printed circuit board 240 may comprise (e.g. only comprise) a single electrical layout layer 262 (e.g., the printed circuit board 240 may be a "single-layer" printed circuit board having all electrical traces and electrical pads on a single electrical layout layer 262). When the light generation module 230 is assembled, the base layer 260 of the printed circuit board 240 may be in contact (e.g., direct contact) with the heat sink 234 (e.g., as shown in FIG. 5). For example, a thermally-conductive substance (e.g., a thermal grease) may be disposed between the printed circuit board 240 (e.g., the base layer 260) and the heat sink 234. According to one example, the dielectric layer 264 may be 50 um thick (e.g., or approximately 50 um thick (although other thicknesses may be used such as 50-150 μm thick)) and/or made of a dielectric material that has a stand-off ~100V and a high thermal conductivity (e.g., greater than 3 W/m/K). For example, the dielectric layer may be made of an organic resin with ceramic fillers (e.g., $Al_2O_3$, AlN, BN) to enhance thermal conductivity.

The drive circuitry 242 and the communication circuitry 244 mounted to the printed circuit board 240 may be electrically connected to the electrical traces and/or electrical pads of the electrical layout layer 262 using a first electrical connection technology, such as soldering technology. For example, the electrical components of the drive circuitry 242 and the communication circuitry 244 may comprise surface-mounted technology (SMT) packages, and may be electrically and mechanically coupled to the electrical pads of the electrical layout layer 262 via solder connections. The solder connections may be made using, for example, an SMT soldering process, such as, a reflow soldering process. In one example, the emitters 252 of the emitter assembly 250 (e.g., and the detectors 254 when included) may also comprise (e.g., be housed in) SMT packages, and may be electrically and mechanically coupled to the electrical pads of the electrical layout layer 262 using the first electrical connection technology (e.g., via solder connections). However, the SMT packages of the emitters 252 and/or the solder connections may increase the thermal resistance (e.g., decrease the thermal conductivity) between the emitters 252 and the heat sink 234.

In another example, the drive circuitry 242 and the communication circuitry 244 mounted to the printed circuit board 240 may be electrically connected to the electrical traces and/or electrical pads of the electrical layout layer 262 using the first electrical connection technology (e.g., soldering technology), while the emitters 252 (e.g., and the detectors 254 when included) may be electrically connected to the electrical traces and/or electrical pads of the electrical layout layer 262 using a second electrical connection technology (e.g., wire-bonding technology). For example, the emitters 252 (e.g., the semiconductor dies of the respective emitters 252) may be mounted (e.g., directly mounted) to the printed circuit board 240 (e.g., as shown in FIGS. 3 and 5), which may decrease the thermal resistance (e.g., increase the thermal conductivity) between the emitters 252 and the heat sink 234 (e.g., as compared to when emitters having SMT packages are mounted using soldering technology). For example, the emitters 252 may be mechanically attached to the printed circuit board 240 using a die attachment process (e.g., via a eutectic die attachment process, which may provide enhanced heat dissipation to the heat sink). As shown in FIG. 5, the emitters 252 (e.g., and the detectors 254 when included) may be electrically connected to the electrical pads of the electrical layout layer 262 via wire bonds 255 (e.g., wire connections) using a wire-bonding process. Accordingly, the printed circuit board 240 may have electrical components mounted thereto and electrically connected to the electrical layout layer 262 via two different electrical connection technologies.

Figure 6A:
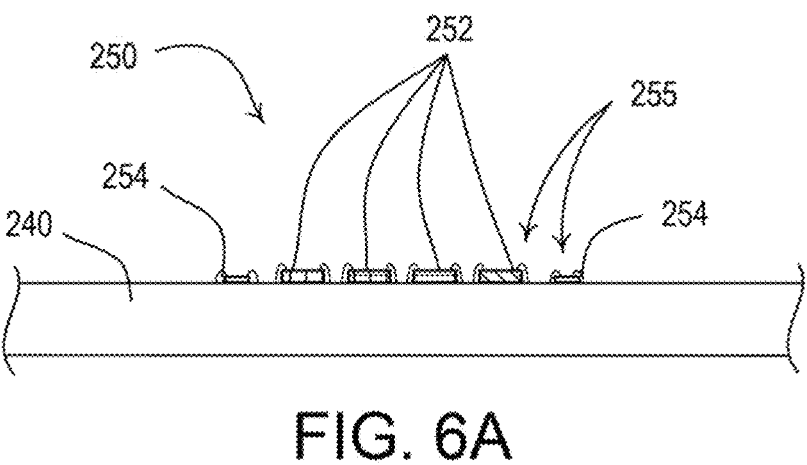
FIGS. 6A-6E are side cross-section views of the emitter assembly of FIG. 5 (e.g., taken through the center of the emitter module) during different steps of an assembly procedure of the emitter assembly.

FIGS. 6A-6E illustrate the emitter assembly 250 at different steps during an assembly procedure for installing the dome 256 onto the printed circuit board 240. FIGS. 6A-6E are side cross-section views of the emitter assembly 250 taken through the center of the emitter assembly 250 (e.g., similar to the cross-section view of FIG. 5). As shown in FIG. 6A, the assembly procedure may begin with the emitter assembly 250 having the emitters 252 and the detectors 254 mounted to the printed circuit board 240 and wire bonds 255 electrically connected to the emitters 252, the detectors 254, and the electrical pads of the electrical layout layer 262 of the printed circuit board 240.

Figure 6B:
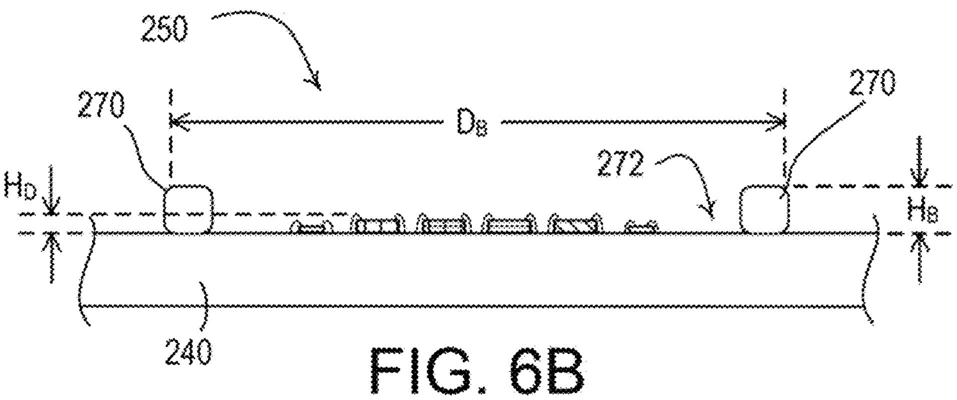
Figures 7, 8:
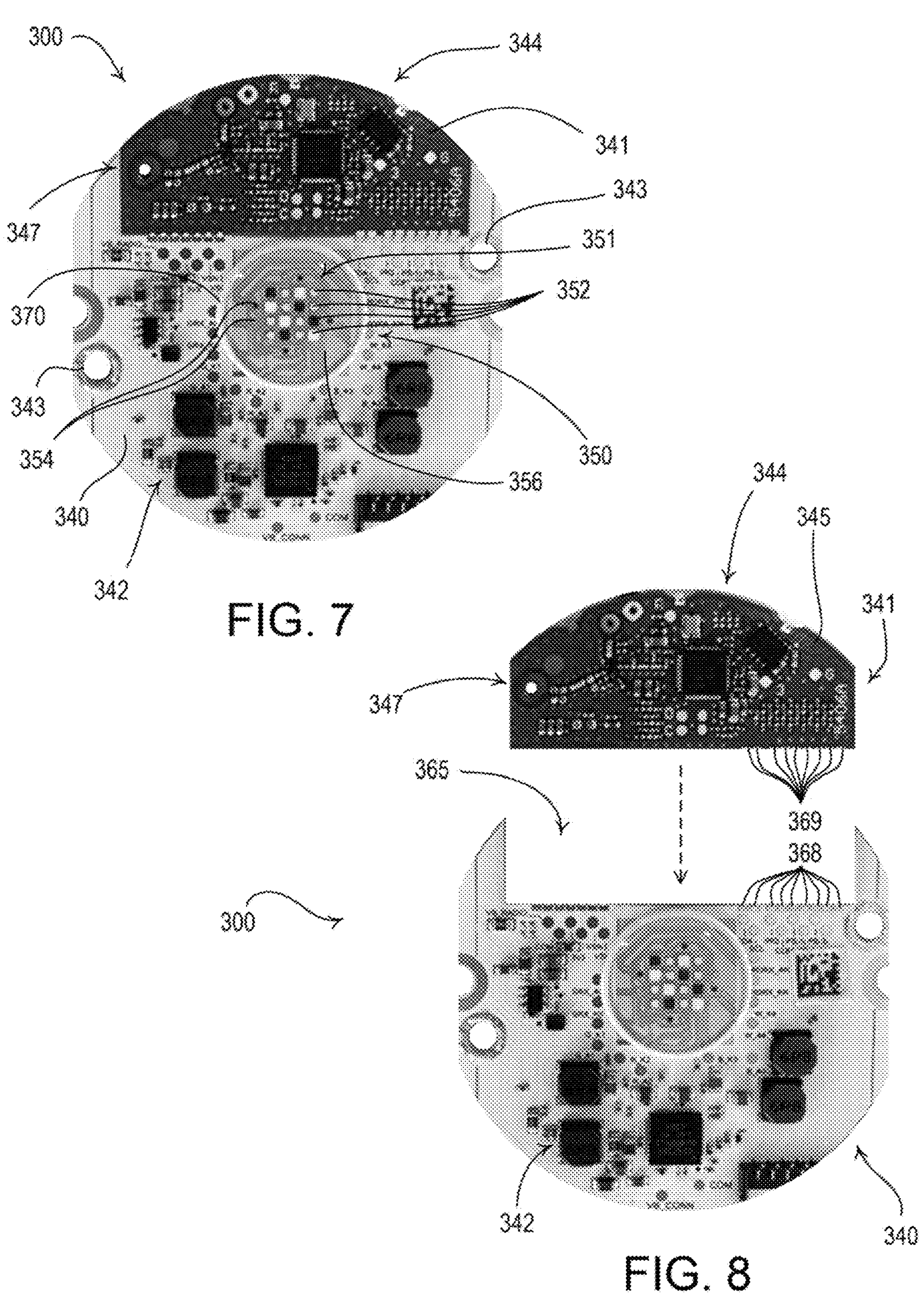
FIG. 7 is a top view of an example printed circuit board assembly.
FIG. 8 is an exploded top view of the example printed circuit board assembly of FIG. 7.
Figure 9:
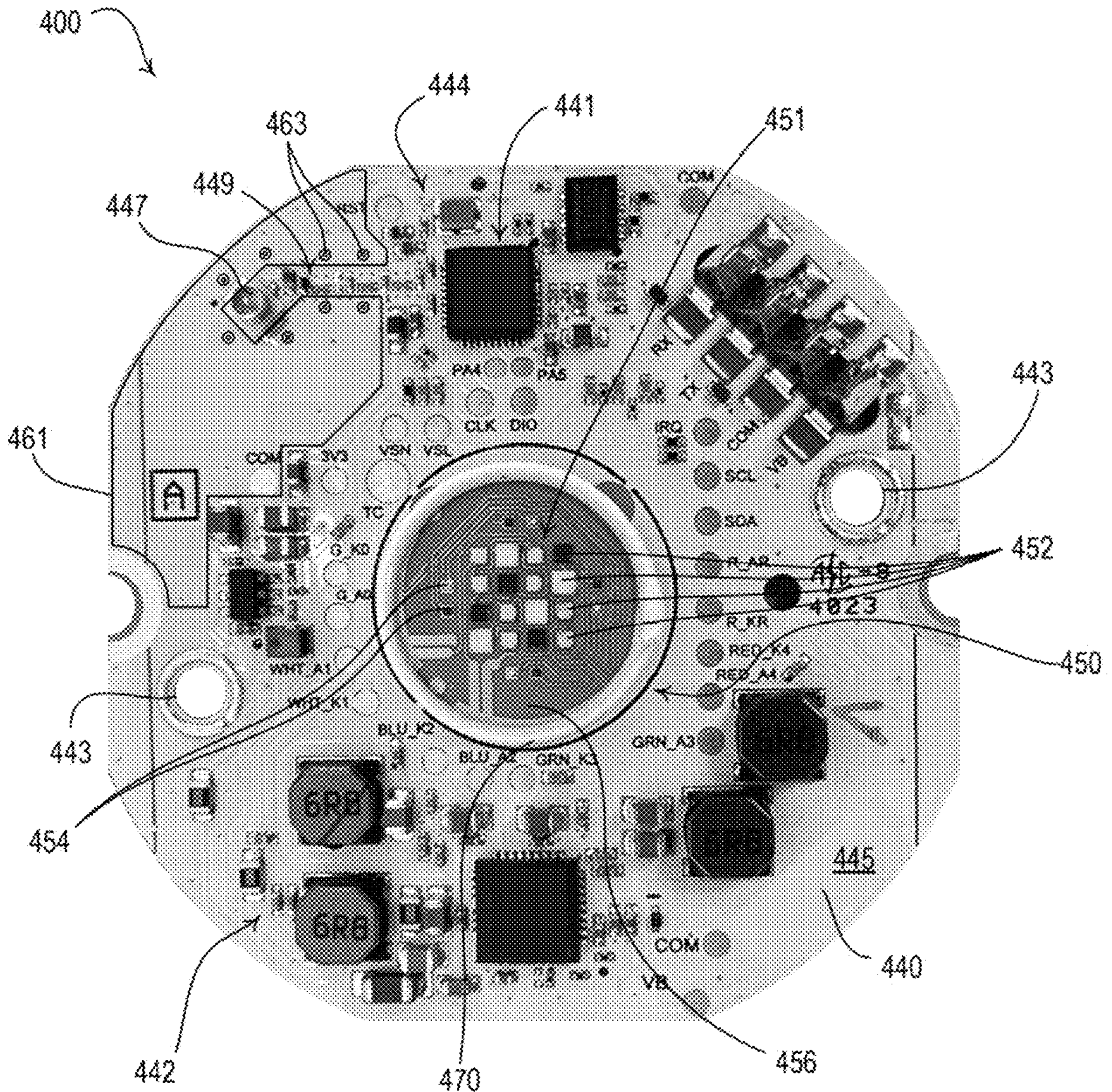
FIG. 9 is a top view of another example printed circuit board assembly.

As shown in FIG. 6B, a barrier 270 (e.g., also referred to herein as a dam) may be formed on the printed circuit board 240 (e.g., on the solder mask layer 266) around the emitters 252 and the detectors 254, when present. For example, the barrier 270 may be formed from a high viscosity, quick setting epoxy. The barrier 270 may be formed in a shape, such as an ellipse (e.g., a circle or an oval) or a polygon (e.g., a square, a rectangle, or a complex polygon shape), that surrounds the emitters 252 and the detectors 254. For example, the barrier 270 may be formed in the shape of a circle (e.g., as shown in FIGS. 7-9, which will be described in greater detail below). The barrier 270 may have a height $H_B$ that is greater than a height $H_D$ of the devices and wires mounted to the printed circuit board 240 (e.g., the emitters 252, the detectors 254, and the wire bonds 255). The barrier 270 may form a recess 272 (e.g., an open volume) between the barrier 270 and the surface of the printed circuit board 240. When the barrier 270 is formed in a circle, the barrier 270 may be characterized by a diameter $D_B$ (e.g., an outer diameter of the barrier 270).

Figure 6C:
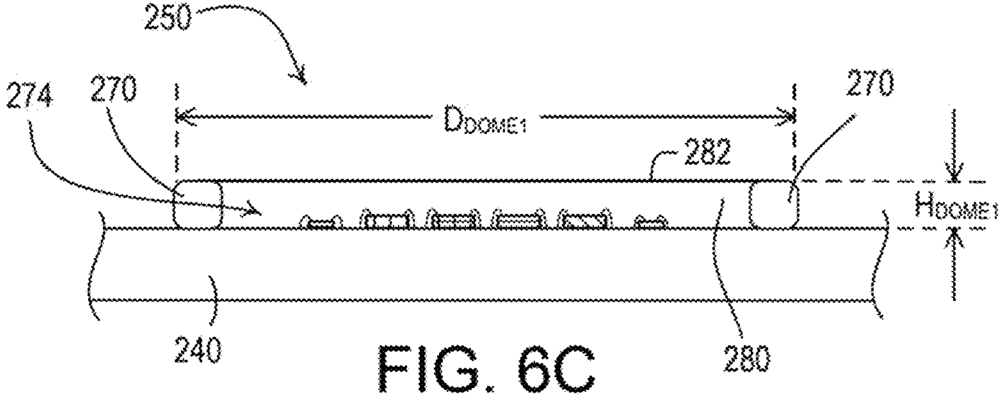

As shown in FIG. 6C, a first material 274 may be deposited (e.g., filled or poured) into the recess 272 formed by the barrier 270 and the printed circuit board 240. The first material 274 in the recess 272 may be configured to form a first dome portion 280 (e.g., after curing the first material 274 as described in greater detail below). For example, the first material 274 may comprise a thermoset material, such as formed from an optical liquid silicone rubber. The first material 274 may be filled to a level such that the first material 274 fully surrounds and covers the emitters 252, the detectors 254, and the wire bonds 255 (e.g., such that the first dome portion 280 may have a height $H_{DOME1}$ that is large enough that the first dome portion 280 fully surrounds and covers (e.g., encapsulates) the emitters 252, the detectors 254, and the wire bonds 255). In some examples, the first material 274 may be filled up to approximately the height $H_B$ of the barrier 270 (e.g., such that the height $H_{DOME1}$ of the first dome portion 280 may be approximately equal to the height $H_B$ of the barrier 270, and a diameter $D_{DOME1}$ of the first dome portion 280 may be approximately the equal to the diameter $D_B$ of the barrier 270). The first dome portion 280 may define an interface surface 282.

Figure 6D:
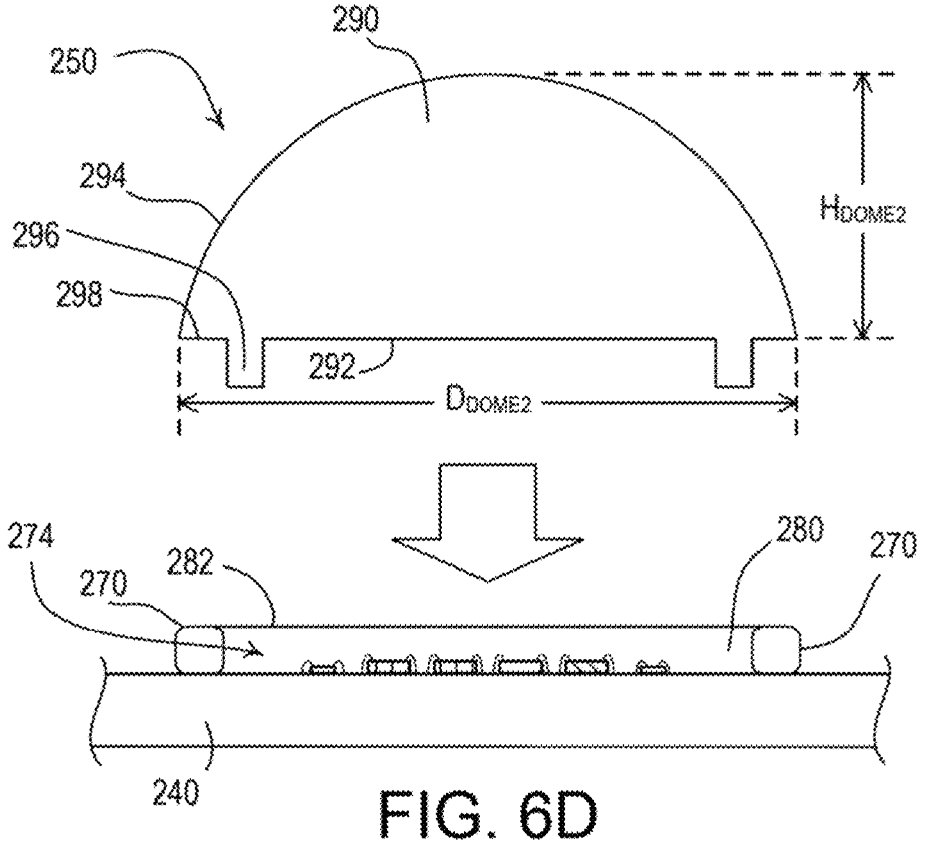

As shown in FIG. 6D, a second dome portion 290 may be placed onto the barrier 270 and/or the first material 274 within the recess 272. For example, the second dome portion 290 may be made during a manufacturing process (e.g., an injection molding process) that is separate from the process for making the first dome portion 280 (e.g., a curing process as will be described in greater detail below). The second dome portion 290 may be fully cured or partially cured (e.g., 70% cured) during the injection molding process. The second dome portion 290 may be optically transmissive (e.g., transparent and/or translucent). The second dome portion 290 may be made from a second material, which may be a clear material or a diffusive material. For example, the second material may be the same as the first material (e.g., a translucent thermoset material, such as formed from an optical liquid silicone rubber). In some examples, the second material of the second dome portion 290 may be different from the first material (e.g., the second material of the second dome portion 290 may be glass, while the first material of the first dome portion 280 may be an optical liquid silicone rubber). The second dome portion 290 may have a shape (e.g., contour) that defines an outer surface 294 and operates to direct light from the emitters 252 in a desired and/or optimal direction (e.g., towards a lens of a lighting device in which the emitter assembly 250 is installed) and to reduce an amount of light that is reflected back into the dome 256. For example, the second dome portion 290 may have a hemispherical shape and have an outer surface 294 that may have a smooth or textured finish.

Figure 6E:
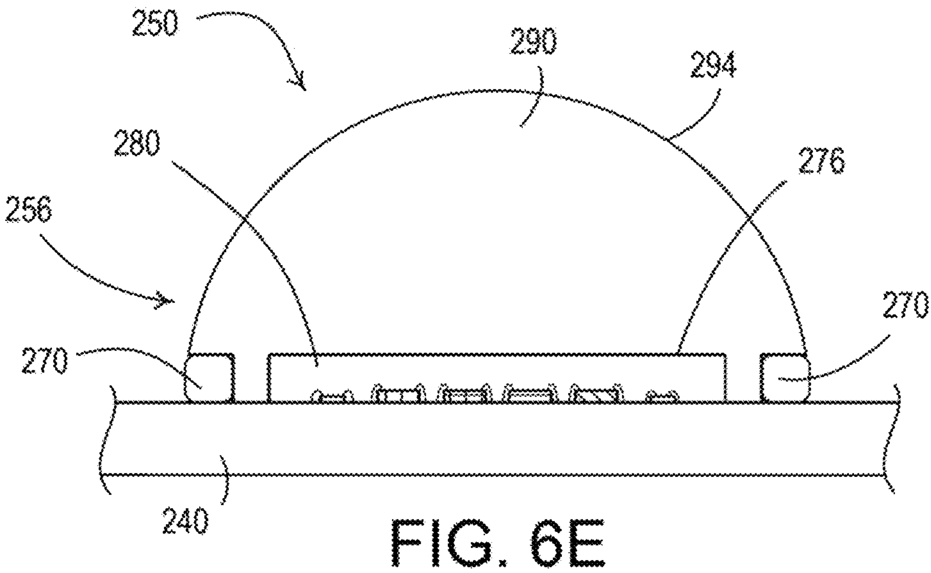

The second dome portion 290 may define an interface surface 292 that may have a smooth or textured finish. For example, the interface surface 292 of the second dome portion 290 may both be substantially flat. The interface surface 292 of the second dome portion 290 may have a circular perimeter and may have a diameter $D_{DOME2}$ that is substantially the same as the diameter $D_B$ of the barrier 270 (e.g., substantially the same as the diameter $D_{DOME1}$ of the first dome portion 280). For example, the perimeter of the interface surface 292 of the second dome portion 290 may be aligned with the barrier 270 (e.g., aligned with the centerline of the barrier 270 and/or falling within an area defined by a width of the barrier 270), for example, as shown in FIG. 6E. The emitters 252 and the detectors 254 may be located within the perimeter of the interface surface 282 of the first dome portion 280 and the perimeter interface surface 292 the second dome portion 290. In some examples, the diameter $D_{DOME2}$ of the interface surface 292 of the second dome portion 290 may be smaller than the diameter $D_B$ of the barrier 270.

The second dome portion 290 may comprise one or more support members 296 (e.g., feet) configured to support the second dome portion 290 relative to the first dome portion 280 (e.g., above and on top of the first dome portion 280). In some examples, the one or more support members 296 may contact a surface of the printed circuit board 240 for supporting the second dome portion 290 relative to the first dome portion 280. The one or more support members 296 may extend from the interface surface 292 of the second dome portion 290 and into the recess defined by the barrier 270. The one or more support members 296 may comprise one or more respective ledge portions 298 that may be supported on the barrier 270 when the one or more support members 296 are received in the recess 272. The one or more support members 296 may comprise, for example, a single support member that extends around the perimeter of the interface surface 292 of the second dome portion 290 or a plurality of support members spaced apart around the perimeter of the interface surface 292 of the second dome portion 290. In some examples, the one or more respective ledge portions 298 may be contiguous such that they form a single ledge portion.

As shown in FIG. 6E, once the second dome portion 290 is placed onto the barrier 270 and/or onto the first dome portion 280, the first material 274 may be cured to form the dome 256 (e.g., the full dome) from the first dome portion 280 and the second dome portion 290. Prior to the curing process, the first material 274 may comprise a liquid material. For example, the interface surface 292 of the second dome portion 290 may bond with the first material 274 of the first dome portion 280 during the curing process. After the curing process, the first dome portion 280 may comprise a cured form of the liquid material (e.g., the first material 274) that is deposited in the recess 272 defined by the barrier 270. When the dome 256 is fully formed, the second dome portion 290 may be located above the first dome portion 280, such that the first dome portion 280 is located between the second dome portion 290 and the printed circuit board 240. The emitters 252 and the detectors 254 may be encapsulated in the first dome portion 280 after the curing process. The first dome portion 280 may be affixed to the printed circuit board 240 and the second dome portion 290 may be affixed to the first dome portion 280 during the curing process.

For example, the first dome portion 280 and the second dome portion 290 may be made of the same or similar materials, such that light from the emitters 252 may be transmitted through the dome 256 (e.g., as if the dome 256 were fabricated from a single material during a single step manufacturing process). While the first dome portion 280 and the second dome portion 290 may be fabricated as independent parts, the first dome portion 280 and the second dome portion 290 may be made of sufficiently similar material and may be brought into contact at appropriate stages of a curing process, such that cross-linking of molecules across the part boundaries may occur at an intersection 276 (e.g., an interface) between the first dome portion 280 and the second dome portion 290. In some examples, the second dome portion 290 may be partially cured when brought into contact with the first dome portion 280. For example, partial curing of the second dome portion 290 during the injection molding process of the second dome portion 290 may allow for stronger cross-linking at the intersection 276 between the first dome portion 280 and the second dome portion 290. At the end of the assembly procedure of the dome 256, the first dome portion 280 and the second dome portion 290 may be, for example, fully cured.

FIG. 7 is a top view of an example printed circuit board assembly 300, which may be deployed as the printed circuit board assembly 232 of the light-generation module 230 shown in FIGS. 2 and 3. FIG. 8 is an exploded top view of the printed circuit board assembly 300. The printed circuit board assembly 300 may comprise a first printed circuit board 340 (e.g., an emitter printed circuit board) and a second printed circuit board 341 (e.g., a communication printed circuit board). The first printed circuit board 340 and the second printed circuit board 341 may be configured to be mechanically and electrically connected to each other. The first printed circuit board 340 may comprise a notch 365 in which the second printed circuit board 341 may be located when the first and second printed circuit boards 340, 341 are mechanically and electrically connected together.

The printed circuit board assembly 300 may include an emitter assembly 350 (e.g., the emitter assembly 250) having an array 351 of emitters 352 (e.g., LEDs). The array 351 of the emitters 352 may be formed as a square and may be located at a center (or substantially center) of the first printed circuit board 340. In some examples, the emitter assembly 350 may also include (e.g., optionally include) one or more detectors 354 (e.g., detection LEDs) located next to the array 351 of the emitters 352. For example, the emitter assembly 350 may comprise sixteen emitters 352 and eight detectors 354, although other variations are possible. In some examples, the emitter assembly 350 may include more or less emitters 352 and more or less detectors 354 than shown in FIG. 7. In addition, different configurations of the emitters 352 and/or the detectors 354 may be used. The emitters 352 and/or the detectors 354 may be mounted to (e.g., directly mounted to) the first printed circuit board 340.

The emitter assembly 350 may include multiple "chains" of the emitters 352 (e.g., series-coupled emitters). The emitters 352 of a given chain may be coupled in series and may conduct the same drive current. Each respective chain may include emitters 352 that produce illumination at the same peak emission wavelength (e.g., emit light of the same color). The emitters 352 of different chains may emit light of different colors from the other chains. For example, the emitter assembly 350 may comprise three or four differently-colored chains of emitters 352 (e.g., red, green, blue, and white, yellow, or mint green). The emitter assembly 350 may include a chain of four red emitters, a chain of four green emitters, a chain of four blue emitters, and a chain of four white or yellow emitters. The individual emitters 352 in each chain may be scattered about the array 351, and arranged so that no color appears twice in any row, column, or diagonal, to improve color mixing within the emitter assembly 350. Other variations of numbers of the emitters 352 per chain, the colors of the emitters 352, the numbers of the colors of the emitters 352, the number of chains of the emitters 352, etc., may be used. According to one example, the array 351 of the emitters 352 may be configured to occupy an area of about 18-20 square millimeters ($mm^2$). In such examples, the dimension $d_{ARRAY}$ of the array 351 of the emitters 352 may be the square root of the area (i.e., 18-20 $mm^2$). Patterns other than a square array may be used. Other variations are possible.

The detectors 354 may be located in pairs close to each edge (e.g., or one or more edges) of the array 351 of the emitters 352 and/or and in the middle or center of the array 351 of the emitters 352 as shown in FIG. 7. Similar to the emitters 352, the detectors 354 may be LEDs that can be used to emit or receive optical or electrical signals. When the detectors 354 are coupled to receive optical signals and emit electrical signals, the detectors may produce currents indicative of incident light from, for example, an emitter 352, a plurality of emitters, or a chain of emitters. The detectors 354 may be any devices that produce currents indicative of incident light, such as a silicon photodiode or an LED. For example, the detectors 354 may each be an LED having a peak emission wavelength in the range of approximately 550 nm to 700 nm, such that the detectors may not produce photocurrent in response to infrared light (e.g., to reduce interference from ambient light). For example, a first detector of each pair of detectors 354 may comprise a small red, orange or yellow LED, which may be used to measure a luminous flux of the light emitted by the red LEDs of the emitters 352. A second detector of each pair of detectors 354 may comprise a green LED, which may be used to measure a respective luminous flux of the light emitted by each of the green and blue LEDs of the emitters 352. Both of the first and second detectors 354 may be used to measure the luminous flux of the white LED (e.g., or other LED, such as a yellow LED or mint green LED) of the emitters 352 at different wavelengths (e.g., to characterize the spectrum of the light emitted by the white LED). The first detectors of each pair of detectors 354 may be coupled in parallel in the emitter assembly 350. Similarly, the second detectors of each pair of detectors 354 may be coupled in parallel in the emitter assembly 350. Other variations are possible.

The emitter assembly 350 may include an optical element, such as a dome 356 (e.g., the dome 256) that is configured to enclose (e.g., encapsulate) the emitters 352 and the detectors 354 mounted to the first printed circuit board 340. The emitters 352 of the emitters assembly 350 may be configured to emit light (e.g., through the dome 356). The dome 356 may be formed on the first printed circuit board 340 (e.g., via a procedure similar to the assembly procedure for forming the dome 256 as shown in FIGS. 6A-6E). For example, the dome 356 may be formed using a barrier 370 (e.g., the barrier 270). According to one example, the printed circuit board assembly 300 may be configured to provide advanced color control features (e.g., warm dimming, CCT control, full color control, and/or color tuning) and produce light in the CCT range of 1400K to 5500K or of 1400K to 5000K, for example, for CCT control. The printed circuit board assembly 300 may be further configured to provide at least 1100 Lumens at 18 W of power, for example. The printed circuit board assembly 300 may be further configured to provide at least 1800 Lumens at 28 W of power, for example. Other examples are possible.

The printed circuit board assembly 300 may comprise drive circuitry 342 that may be mounted to the first printed circuit board 340 and may control the amount of power delivered to the emitters 352 of the emitter assembly 350. For example, the drive circuitry 342 mounted to the first printed circuit board 340 may include a plurality of electrical components, such as one or more drive circuits for controlling the emitters 352 and one or more control circuits for controlling the drive circuits. The drive circuitry 342 (e.g., the one or more control circuits) may be configured to control the emitters 352 of the emitter assembly 350 and to thus adjust an intensity level and/or a color of a cumulative light emitted by the printed circuit board assembly 300. For example, the drive circuitry 342 may be configured to control the emitters 352 to adjust the intensity level of the cumulative light emitted by the printed circuit board assembly 300 between a high-end intensity level (e.g., a maximum intensity level, such as approximately 100%) and a low-end intensity level (e.g., a minimum intensity level, such as approximately 0.1%-1.0%). In addition, the drive circuitry 342 may be configured to control the emitters 352 to adjust a present color temperature (e.g., a correlated color temperature (CCT) of the cumulative light emitted by the printed circuit board assembly 300. Further, the drive circuitry 342 may be configured to control the emitters 352 to adjust a present color value (e.g., which may be defined by a present x-chromaticity coordinate and a present y-chromaticity coordinate) of the cumulative light emitted by the printed circuit board assembly 300. While the printed circuit board assembly 300 is described herein with the present color value defined by the present x-chromaticity coordinate and the present y-chromaticity coordinate, the present color value could be defined by other color values (e.g., as defined in other color spaces). For example, the present color value by be a red-green-blue (RGB) color value (e.g., as defined by a red value, a green value, and a blue value, and/or a hex value in the RGB color space) a UVW color value (e.g., as defined by a u-chromaticity value, a v-chromaticity value, and a lightness index (e.g., w) value in the UVW color space), a wavelength, and/or other suitable color value.

The printed circuit board assembly 300 may also comprise communication circuitry 344 that may be mounted to the second printed circuit board 341 and may be configured to communicate messages via signals, such as wireless signals (e.g., RF signals) with devices external/separate from printed circuit board assembly 300. For example, the communication circuitry 344 may include a plurality of electrical components, such as one or more communication circuits for communicating messages via wireless signals, for example, and one or more control circuits for interfacing between the communication circuits and the drive circuitry 342. The communication circuitry 444 may comprise, for example, a processor mounted to second printed circuit board 341. The processor may comprise, for example, a microprocessor, a microcontroller, a programmable logic device (PLD), an application specific integrated circuit (ASIC), a field-programmable gate array (FPGA), or any other suitable processing device or controller. The communication circuitry 344 (e.g., the processor) may be configured to control the drive circuitry 342 (e.g., directly or indirectly via the one or more control circuits) to control the emitters 352 of the emitter assembly 350 in response to messages received via wireless signals, for example.

The emitters 352 of the emitter assembly 350 may be thermally coupled to a heat sink of a light-generation module (e.g., the heat sink 234) via the first printed circuit board 340, such that the heat sink is configured to dissipate heat generated by the emitters 352 of the emitter assembly 350. For example, the first printed circuit board 340 may comprise a metal-core printed circuit board, which may provide for higher thermal conductivity and lower thermal resistance between the emitters 352 and the heat sink (e.g., as compared to a printed circuit board made from a more standard substrate, such as an FR4 substrate). The printed circuit board 340 may be attached to the heat sink and/or a socket (e.g., the socket 236) of the light-generation module via one or more fasteners (e.g., such as the fasteners 235) receive through openings 343 in the printed circuit board 340 and corresponding openings in the heat sink and/or the socket. For example, the fasteners may comprise screws and/or rivets. The heat sink may be made of aluminum, although steel, copper, or other metals may be used. In some examples, the heat sink may be approximately 0.25 inches thick, although other thicknesses may be used.

While not shown in FIGS. 7 and 8, the first printed circuit board 340 may comprise a base layer (e.g., the base layer 260), an electrical layout layer (e.g., the electrical layout layer 262), a dielectric layer (e.g., the dielectric layer 264), and a solder mask layer (e.g., the solder mask layer 266), for example, in a similar configuration as the layers of the printed circuit board 240 shown in FIG. 5. For example, the base layer may be a thermally-conductive substrate, such as copper, aluminum, alumina, ceramic, or combinations thereof. The base layer may have a thickness of one millimeter (e.g., although other thicknesses may be used). The base layer may be physically and/or thermally connected to the heat sink, such as through a thermal grease. Since the presence of the dielectric layer may increase the thermal resistance (e.g., decrease the thermal conductivity) between the emitters 352 and the heat sink, a thickness of the dielectric layer of the first printed circuit board 340 may be decreased to decrease the thermal resistance between the emitters 352 and the heat sink. In addition, the first printed circuit board 340 may comprise (e.g., only comprise) a single dielectric layer (e.g., to further decrease the thermal resistance between the emitters 352 and the heat sink) and thus a single (e.g., only a single) electrical layout layer (e.g., the first printed circuit board 340 may be a "single-layer" printed circuit board having all electrical traces and electrical pads on a single electrical layout layer). According to one example, the dielectric layer may be approximately 50 micrometers thick (e.g., or approximately 50 micrometers thick (e.g., although other thicknesses may be used, such as approximately 50-150 micrometers)) and/or made of a dielectric material that has a stand-off of approximately 100 volts (e.g., a breakdown voltage of approximately 100 volts) and a high thermal conductivity (e.g., greater than approximately 3 W/m/K). For example, the dielectric layer may be made of an organic resin with ceramic fillers (e.g., aluminum oxide ($Al_2O_3$), aluminum nitride (AlN), boron nitride (BN), etc.) to enhance thermal conductivity. When the first printed circuit board 340 is installed in a light-generation module, the base layer of the first printed circuit board 340 may be in contact (e.g., direct contact) with the heat sink (e.g., in a similar manner as the printed circuit board 240 contacts the heat sink 234 as shown in FIG. 5). Further, in some examples, a thermally-conductive substance (e.g., a thermal grease) may be disposed between the printed circuit board 340 and the heat sink.

The drive circuitry 342 mounted to the first printed circuit board 340 may be electrically connected to electrical traces and/or electrical pads of the electrical layout layer of the first printed circuit board 340 using a first electrical connection technology, such as soldering technology. For example, the electrical components of the drive circuitry 342 may comprise SMT packages, and may be electrically and mechanically coupled to the electrical pads of the electrical layout layer via solder connections. The solder connections may be made using, for example, an SMT soldering process, such as, a reflow soldering process. The emitters 352 (e.g., and the detectors 354 when included) may not be configured as SMT packages, for example, and may be electrically connected to electrical traces and/or electrical pads of the electrical layout layer of the first printed circuit board 340 using a second electrical connection technology (e.g., wire-bonding technology). For example, the emitters 352 (e.g., the semiconductor dies of the respective emitters 352) may be mounted (e.g., directly mounted) to the first printed circuit board 340, which may decrease the thermal resistance (e.g., increase the thermal conductivity) between the emitters 352 and the heat sink (e.g., as compared to when emitters having SMT packages are mounted using soldering technology). For example, the emitters 352 may be mechanically attached to the first printed circuit board 340 using a die attachment process (e.g., via a eutectic die attachment process, which may provide enhanced heat dissipation to the heat sink). The emitters 352 (e.g., and the detectors 354 when included) may be electrically connected to the electrical pads of the electrical layout layer of the first printed circuit board 340 via wire bonds (e.g., such as the wire bonds 255) via a wire-bonding process. Accordingly, the first printed circuit board 340 may have electrical components mounted thereto and electrically connected to the electrical layout layer via two different electrical connection technologies.

As shown in FIG. 8, the second printed circuit board 341 may be configured to fit into the notch 365 in the first printed circuit board 340. The second printed circuit board 341 may be electrically and mechanically coupled to the first printed circuit board 340 via a plurality of electrical pads 369 on the second printed circuit board 341 that may be soldered to respective electrical pads 368 on the first printed circuit board 340. Since the emitters 352, for example, are not attached to the second printed circuit board 341, the second printed circuit board 341 may not be a metal-core printed circuit board (e.g., although a metal-core printed circuit board may be used), and may comprise a more standard substrate, such as an FR4 substrate. In addition, the second printed circuit board 341 may comprise a multi-layer printed circuit board (e.g., a two-layer or four-layer electrical layout printed circuit board), although in other examples, a single layer printed circuit board may be used. The electrical components of the communication circuitry 344 may be mounted to a front side 345 side of the second printed circuit board 341. In addition and/or alternatively, the electrical components of the communication circuitry 344 may also be mounted to a bottom side of the second printed circuit board 341. The communication circuitry 344 mounted to the second printed circuit board 341 may be electrically connected to electrical traces and/or electrical pads of the second printed circuit board 341 using the first electrical connection technology (e.g., soldering technology). For example, the electrical components of the communication circuitry 344 may comprise SMT packages, and may be electrically and mechanically coupled to electrical pads of an electrical layout layer(s) via solder connections. The solder connections may be made using, for example, an SMT soldering process, such as, a reflow soldering process. When the second printed circuit board 341 is a multi-layer printed circuit board, one or more of the layers of the second printed circuit board 341 may comprise a ground plane, which may be coupled to circuit common on the communication circuitry 344.

The printed circuit board assembly 300 may also comprise an antenna (not shown) for transmitting and/or and receiving wireless signals. The one or more communication circuits of the communication circuitry 344 mounted to the second printed circuit board 341 may be electrically coupled to the antenna for transmitting and/or receiving wireless signals from/to external devices. For example, the communication circuit(s) may include a radio-frequency (RF) transceiver coupled to the antenna for transmitting and/or receiving RF signals. In addition and/or alternatively, the communication circuit(s) may be an RF transmitter for transmitting RF signals and/or an RF receiver for receiving RF signals via the antenna. In some examples, since the second printed circuit board 341 is located in the notch 365 in the first printed circuit board 340, the antenna may be located on one or more of the layers of the second printed circuit board 341. In some examples, since the second printed circuit board 341 is separate from the first printed circuit board 340 and may be a multi-layer printed circuit board, the antenna may be located on one or more of the layers of the printed circuit board. According to another example (e.g., irrespective of whether the second printed circuit board 341 is single-layered or multi-layered), the antenna may comprise a wire that is soldered, for example, to a through-hole 347, for example, that extends through the second printed circuit board 341. The antenna may extend from the second printed circuit board 341 and may be held in place by an antenna holder (e.g., such as the antenna holder 248). As a further example (e.g., irrespective whether the second printed circuit board 341 is single-layered or multi-layered), the antenna may comprise a wire that is connected to an antenna connector mounted to the second printed circuit board 341. The antenna may extend from the second printed circuit board 341 and may be held in place by an antenna holder (e.g., such as the antenna holder 248).

FIG. 9 is a top view of another example printed circuit board assembly 400, which may be deployed as the printed circuit board assembly 232 of the light-generation module 230 shown in FIGS. 2 and 3. The printed circuit board assembly 400 may comprise a printed circuit board 440 (e.g., a single printed circuit board) and an emitter assembly 450 (e.g., the emitter assembly 250) having one or more emitters, such as an array 451 of emitters 452 (e.g., LEDs). The array 451 of the emitters 452 may be formed as a square of emitters and may be located at a center or substantially center of the printed circuit board 440. In some examples, the emitter assembly 450 may also include (e.g., optionally include) one or more detectors 454 (e.g., detection LEDs) located next to the array 451 of the emitters 452. For example, the emitter assembly 450 may comprise sixteen emitters 452 and eight detectors 454, although other variations are possible. In some examples, the emitter assembly 450 may include more or less emitters 452 and more or less detectors 454 than shown in FIG. 9. In addition, different configurations of the emitters 452 and/or the detectors 454 may be used. The emitters 452 and/or the detectors 454 may be mounted to (e.g., directly mounted to) the printed circuit board 440.

The emitter assembly 450 may include multiple "chains" of the emitters 452 (e.g., series-coupled emitters). The emitters 452 of a given chain may be coupled in series and may conduct the same drive current. Each respective chain may include emitters 452 that produce illumination at the same peak emission wavelength (e.g., emit light of the same color). The emitters 452 of different chains may emit light of different colors. For example, the emitter assembly 450 may comprise four differently-colored chains of emitters 452 (e.g., red, green, blue, and white, yellow, or mint green emitters). The emitter assembly 450 may include a chain of four red emitters, a chain of four green emitters, a chain of four blue emitters, and a chain of four white, yellow, or mint green emitters. The individual emitters 452 in each chain may be scattered about the array 451, and arranged so that no color appears twice in any row, column, or diagonal, to improve color mixing within the emitter assembly 450. Other variations of numbers of the emitters 452 per chain, the colors of the emitters 452, the numbers of the colors of the emitters 452, the number of chains of the emitters 452, etc., may be used. According to one example, the emitters may be configured to occupy an area of about 18 to 20 mm squared. Patterns other than a square array may be used. Other variations are possible.

The detectors 454 may be located in pairs close to each edge (e.g., or one or more edges) of the array 451 of the emitters 452 and/or in the middle of the array 451 of the emitters 452 as shown in FIG. 9. Similar to the emitters 452, the detectors 454 may be LEDs that can be used to emit or receive optical or electrical signals. When the detectors 454 are coupled to receive optical signals and emit electrical signals, the detectors may produce currents indicative of incident light from, for example, an emitter, a plurality of emitters, or a chain of emitters. The detectors 454 may be any devices that produce currents indicative of incident light, such as a silicon photodiode or an LED. For example, the detectors 454 may each be an LED having a peak emission wavelength in the range of approximately 550 nm to 700 nm, such that the detectors may not produce photocurrent in response to infrared light (e.g., to reduce interference from ambient light). For example, a first detector of each pair of detectors 454 may comprise a small red, orange or yellow LED, which may be used to measure a luminous flux of the light emitted by the red LEDs of the emitters 452. A second detector of each pair of detectors 454 may comprise a green LED, which may be used to measure a respective luminous flux of the light emitted by each of the green and blue LEDs of the emitters 452. Both of the first and second detectors 454 may be used to measure the luminous flux of the white LEDs (e.g., or other LEDs, such as a yellow LEDs or light green LED or mint green LEDs) of the emitters 452 at different wavelengths (e.g., to characterize the spectrum of the light emitted by the white LEDs). The first detectors of each pair of detectors 454 may be coupled in parallel in the emitter assembly 450. Similarly, the second detectors of each pair of detectors 454 may be coupled in parallel in the emitter assembly 450. Other variations are possible. According to one example, the printed circuit board assembly 400 may be configured to as a warm dimming module, CCT control module, full color control module, and/or color tuning module, and may produce light in the CCT range of 1400K to 5000K, for example, for CCT control. The printed circuit board assembly 400 may be further configured to provide at least 1100 Lumens at 18 W of power, for example. According to another example, the printed circuit board assembly 400 may be configured to as a warm dimming module, a full color control module, a CCT control module, and/or color tuning module, an may produce light in the CCT range of 1400K to 5500K, for example, for CCT control. In either example, the printed circuit board assembly 400 may be further configured to provide at least 1800 Lumens at 28 W of power, for example. Other examples are possible.

The emitter assembly 450 may include an optical element, such as a dome 456 (e.g., the dome 256) that is configured to enclose (e.g., encapsulate) the emitters 452 and the detectors 454 mounted to the printed circuit board 440. The emitters 452 of the emitters assembly 450 may be configured to emit light (e.g., through the dome 456). The dome 456 may be formed on a surface of the printed circuit board 440 on a front side 445 (e.g., via a procedure similar to the assembly procedure for forming the dome 256 as shown in FIGS. 6A-6E). For example, the dome 456 may be formed using a barrier 470 (e.g., the barrier 270).

The printed circuit board assembly 400 may comprise drive circuitry 442 that may be mounted to the printed circuit board 440 (e.g., to a front side 445 of the printed circuit board 440) and may control the amount of power delivered to the emitters 452 of the emitter assembly 450. For example, the drive circuitry 442 mounted to the printed circuit board 440 may include a plurality of electrical components, such as one or more drive circuits for controlling the emitters 452 and one or more control circuits for controlling the drive circuits. The drive circuitry 442 (e.g., the one or more control circuits) may be configured to control the emitters 452 of the emitter assembly 450 and to thus adjust an intensity level and/or a color of a cumulative light emitted by the light-generation module. For example, the drive circuitry 442 may be configured to control the emitters 452 to adjust the intensity level of the cumulative light emitted by the light-generation module 430 between a high-end intensity level (e.g., a maximum intensity level, such as approximately 100%) and a low-end intensity level (e.g., a minimum intensity level, such as approximately 0.1%-1.0%). In addition, the drive circuitry 442 may be configured to control the emitters 452 to adjust a present color temperature (e.g., a correlated color temperature (CCT) of the cumulative light emitted by the light-generation module. Further, the drive circuitry 442 may be configured to control the emitters 452 to adjust a present color value (e.g., which may be defined by a present x-chromaticity coordinate $X_{PRES}$ and a present y-chromaticity coordinate) of the cumulative light emitted by the light-generation module. While the printed circuit board assembly 400 is described herein with the present color value defined by the present x-chromaticity coordinate and the present y-chromaticity coordinate, the present color value could be defined by other color values (e.g., as defined in other color spaces). For example, the present color value by be a red-green-blue (RGB) color value (e.g., as defined by a red value, a green value, and a blue value, and/or a hex value in the RGB color space) a UVW color value (e.g., as defined by a u-chromaticity value, a v-chromaticity value, and a lightness index (e.g., w) value in the UVW color space), a wavelength, and/or other suitable color value.

The printed circuit board assembly 400 may also comprise communication circuitry 444 that may be mounted to the printed circuit board 440 (e.g., to the front side 445) and may be configured to communicate message via signals such as wireless signals (e.g., RF signals) with devices external to/separate from printed circuit board assembly 400. For example, the communication circuitry 444 may include a plurality of electrical components, such as one or more communication circuits for communicating message via signals such as wireless signals, and one or more control circuits for interfacing between the communication circuits and the drive circuitry 442. The communication circuitry 444 may comprise, for example, a processor 441 mounted to the front side 445 of the printed circuit board 440. The processor 441 may comprise, for example, a microprocessor, a microcontroller, a programmable logic device (PLD), an application specific integrated circuit (ASIC), a field-programmable gate array (FPGA), or any other suitable processing device or controller. The communication circuitry 444 (e.g., the processor 441) may be configured to control the drive circuitry 442 (e.g., directly or indirectly via the one or more control circuits) to control the emitters 452 of the emitter assembly 450 in response to messages received via the signals received by the communication circuitry 444.

The emitters 452 of the emitter assembly 450 may be thermally coupled to a heat sink of the light-generation module (e.g., the heat sink 234) via the printed circuit board 440, such that the heat sink is configured to dissipate heat generated by the emitters 452 of the emitter assembly 450. For example, the printed circuit board 440 may comprise a metal-core printed circuit board, which may provide for higher thermal conductivity and lower thermal resistance between the emitters 452 and the heat sink 434 (e.g., as compared to a printed circuit board made from a more standard substrate, such as an FR4 substrate). The printed circuit board 440 may be attached to the heat sink and/or a socket (e.g., the socket 236) of the light-generation module via one or more fasteners (e.g., such as the fasteners 235) received through openings 443 in the printed circuit board 440 and corresponding openings in the heat sink and/or the socket. For example, the fasteners may comprise screws and/or rivets. The heat sink may be made of aluminum, although steel, copper, or other metals may be used. In some examples, the heat sink may be approximately 0.25 inches thick, although other thicknesses may be used.

While not shown in FIG. 9, the printed circuit board 440 may comprise a base layer (e.g., the base layer 260), an electrical layout layer (e.g., the electrical layout layer 262), a dielectric layer (e.g., the dielectric layer 264), and a solder mask layer (e.g., the solder mask layer 266), for example, in a similar configuration as the layers of the printed circuit board 240 shown in FIG. 5. The base layer may be a thermally-conductive substrate, such as copper, aluminum, alumina, ceramic, or combinations thereof. The base layer may have a thickness of 1 mm (e.g., although other thicknesses may be used). The base layer may be physically and/or thermally connected to the heat sink, such as through a thermal grease. Since the presence of the dielectric layer may increase the thermal resistance (e.g., decrease the thermal conductivity) between the emitters 452 and the heat sink, a thickness of the dielectric layer of the printed circuit board 440 may be decreased to decrease the thermal resistance between the emitters 452 and the heat sink. In addition, the printed circuit board 440 may comprise (e.g., only comprise) a single dielectric layer (e.g., to further decrease the thermal resistance between the emitters 452 and the heat sink), and thus a single (e.g., only a single) electrical layout layer (e.g., the printed circuit board 440 may be a "single-layer" printed circuit board having all electrical traces and electrical pads on a single electrical layout layer). According to one example, the dielectric layer may be 50 um thick (e.g., or approximately 50 um thick (e.g., although other thicknesses may be used such as 50-150 μm thick)) and/or made of a dielectric material that has a stand-off approximately 100V and a high thermal conductivity (e.g., greater than 3 W/m/K). For example, the dielectric layer may be made of an organic resin with ceramic fillers (e.g., $Al_2O_3$, AlN, BN) to enhance thermal conductivity. When the printed circuit board 440 is installed in a light-generation module, the base layer of the printed circuit board 440 may be in contact (e.g., direct contact) with the heat sink (e.g., in a similar manner as the printed circuit board 240 contacts the heat sink 234 as shown in FIG. 5, such as via a thermal grease). According to this example, the printed circuit board 440 may be shaped as a disc, as shown, with a diameter of 2 inches (e.g., or approximately 2 inches), although other sizes may be used.

The drive circuitry 442 and the communication circuitry 444 mounted to the printed circuit board 440 may be electrically connected to electrical traces and/or electrical pads of the electrical layout layer using a first electrical connection technology, such as soldering technology. For example, the electrical components of the drive circuitry 442 and the communication circuitry 444 may comprise SMT packages, and may be electrically and mechanically coupled to the electrical pads of the electrical layout layer via solder connections. The solder connections may be made using, for example, an SMT soldering process, such as, a reflow soldering process. The emitters 452 (e.g., and the detectors 454 when included) may be electrically connected to the electrical traces and/or electrical pads of the electrical layout layer using a second electrical connection technology (e.g., wire-bonding technology). For example, the emitters 452 (e.g., the semiconductor dies of the respective emitters 452) may be mounted (e.g., directly mounted) to the printed circuit board 440, which may decrease the thermal resistance (e.g., increase the thermal conductivity) between the emitters 452 and the heat sink (e.g., as compared to when emitters having SMT packages are mounted using soldering technology). For example, the emitters 452 may be mechanically attached to the first printed circuit board 340 using a die attachment process (e.g., via a eutectic die attachment process, which for example, may provide enhanced heat dissipation to the heat sink). The emitters 452 (e.g., and the detectors 454 when included) may be electrically connected to the electrical pads of the electrical layout layer of the printed circuit board 440 via wire bonds (e.g., such as the wire bonds 255) via a wire-bonding process. Accordingly, the printed circuit board 440 may have electrical components mounted thereto and electrically connected to the electrical layout layer via two different electrical connection technologies.

Since the printed circuit board 440 is a "single-layer" printed circuit board, the layout of the electrical traces and electrical pads of the electrical layout layer of the printed circuit board 440 may be complex. For example, some electrical traces may run under electrical components mounted to the printed circuit board 440 (e.g., between the electrical pads to which the respective electrical component is mounted). In some examples, when two electrical traces may need to cross each other without being electrically connected to each other, a jumper (e.g., having a resistance of approximately zero ohms (Ω)) may be included in series with one of the electrical traces such that the second electrical trace may be routed underneath the jumper. For example, a magnitude of current conducted through the electrical trace in series with the jumper may be less than a magnitude of current conducted through the electrical trace that is routed underneath the jumper. In some examples, a jumper of a larger size may be used such that a plurality of electrical traces may be routed underneath the jumper. In other and/or additional examples, the electrical trace(s) that are routed underneath the jumper may conduct static signals (e.g., a supply voltage rail, a circuit common, etc.) or low frequency signals while the electrical trace in series with the jumper may conduct signals that are non-static/varying, or have a frequency of a higher value than the frequency of a signal running under the jumper.

Since the communication circuitry 444 is sensitive to noise that may be generated by other signals on the printed circuit board 440 (e.g., signals generated by the drive circuitry 442), the drive circuitry 442 may be mounted to the opposite side of the front side 445 of the printed circuit board 440 as the communication circuitry 444 (e.g., to prevent cross-talk between the communication circuitry 444 and the rest of the circuitry on the printed circuit board 440 (e.g., the drive circuitry 442 and/or the emitter assembly 450)). For example, assuming the printed circuit board 440 is bisected down the middle, through the emitter assembly 450, into two halves (e.g., two half cicles), the communication circuitry 444 may be positioned on one half and the drive circuitry 442 positioned on the other opposing half. Further, the communication circuitry 444 and the drive circuitry 442 may be positioned towards the perimeter edge of the printed circuit board 440 of their respective halves.

While the thickness of the dielectric layer of the printed circuit board 440 may be minimized to decrease the thermal impedance between the emitters 452 and the heat sink (e.g., as previously mentioned), decreasing the thickness of the dielectric layer may also increase capacitance between the electrical layout layer (e.g., the electrical layout layer 262) and the base layer (e.g., the base layer 260). This may lead to increased capacitance at nodes (e.g., connection points) of the communication circuitry 444, which may be detrimental to operation of the communication circuitry 444. Accordingly, the thickness of the dielectric layer may be minimized to decrease the thermal impedance between the emitters 452 and the heat sink, but not to a value that results in poor operation of the communication circuitry 444. For example, the thickness of the dielectric layer may be approximately 50-150 μm. In some examples, the emitter assembly 450 may include four differently-colored chains of emitters 452 (e.g., a chain of four red emitters, a chain of four green emitters, a chain of four blue emitters, and a chain of four white, yellow, or mint green emitters) and produce a lumen output of 1,800 lumens, and in such examples, a dielectric layer having a thickness of approximately 50-150 μm may provide a balance between heat dissipation and communication interference (e.g., when communicating at 2.4 MHz).

The printed circuit board assembly 400 may also comprise an antenna (not shown) for communicating messages in wireless signals with external devices. The one or more wireless communication circuits of the communication circuitry 444 mounted to the printed circuit board 440 may be electrically coupled (e.g., directly or indirectly) to the antenna for transmitting and/or receiving the messages via wireless signals from/to external devices. Since the printed circuit board 440 is a metal-core printed circuit board, the antenna may not be formed on the single electrical layout layer of the printed circuit board 440 (e.g., since such an antenna would not be able to generate RF signals through the base layer of the metal-core printed circuit board). According to this example, the antenna may extend from the printed circuit board 440 (e.g., extend from the electrical layout layer of the printed circuit board 440). The antenna may be electrically and mechanically connected to an antenna connector 447 mounted to the printed circuit board 440 (e.g., to the front side 445, which may be electrically coupled (e.g., directly or indirectly) to the communication circuitry 444). In addition and/or alternatively, the antenna may be soldered to a pad of the single electrical layout layer and/or to a through-hole (e.g., not shown in FIG. 9, but the through-hole may be similar to the through-hole 347), which may be electrically coupled (e.g., directly or indirectly) to the communication circuitry 444. For example, the antenna may comprise a monopole antenna that extends from the printed circuit board 440 (e.g., such as the antenna 246 shown in FIGS. 2 and 3). The antenna may be held in place in a position that extends from the printed circuit board 440 by an antenna holder (e.g., the antenna holder 248). For instance, the antenna may extend outward away from the plane defined by the printed circuit board 440. In some examples, the antenna may be tuned to 2.4 MHz.

The communication circuitry 444 mounted to the printed circuit board 440 may comprise a matching network circuit 449. The matching network circuit 449 may be electrically coupled between the antenna (e.g., the antenna connector 447) and the processor 441. For example, the matching network circuit 449 may be configured to match an impedance of the antenna to an impedance of the communication circuitry 444 (e.g., the electrical components of the communication circuitry 444 not including the matching network circuit 449) to obtain a maximum transfer of power between the antenna and the communication circuitry 444 (e.g., to optimize the performance of the antenna and the communication circuitry 444). The matching network circuit 449 may include, for example, a multi-stage inductor-capacitor (LC) filter circuit. The antenna connector 447 and the matching network circuit 449 may be surrounded (e.g., at least partially surrounded) by a ground plane 461 on the electrical layout layer of the printed circuit board 440. The ground plane 461 may extend across an area on the front side 445 of the printed circuit board 440. The ground plane 461 may be electrically coupled to circuit common of the communication circuitry 444.

The ground plane 461 may also be electrically coupled to the base layer (e.g., such as the base layer 260) of the printed circuit board 440 (e.g., in addition to the ground plane 461 being electrically coupled to circuit common of the communication circuitry 444). In some examples, the ground plane 461 may be electrically coupled to the base layer of the printed circuit board 440 through one or more vias 463. The one or more vias 463 of the printed circuit board 440 may be located within the area of the ground plane 461 surrounding the antenna connector 447 and the matching network circuit 449. The vias 463 may each comprise a hole drilled into the printed circuit board 440 (e.g., extending from the front side 445, through the solder mask layer, the electrical layout layer, the dielectric layer, and into the base layer). In some examples, one or more of the vias 463 may not extend entirely through the printed circuit board 440. The vias 463 may be filled with an electrically-conductive material, such as a silver epoxy material, and may operate to electrically connect the ground plane 461 on the electrical layout layer and the base layer. In addition and/or alternatively, the ground plane 461 may be electrically coupled to the base layer of the printed circuit board 440 through other electrical connections (e.g., rather than through the vias 463). The ground plane 461 may be electrically coupled to the base layer of the printed circuit board 440 through, for example, the fasteners (e.g., screws and/or rivets) received through the openings 443. For example, the openings 443 may be plated and/or coated with an electrically-conductive material. In other examples, the matching network circuit 449 may be connected to circuit common, and circuit common may be connected to the metal core/base layer (e.g., which may cause the metal core/base layer to also act as a ground plane).

Figure 10:
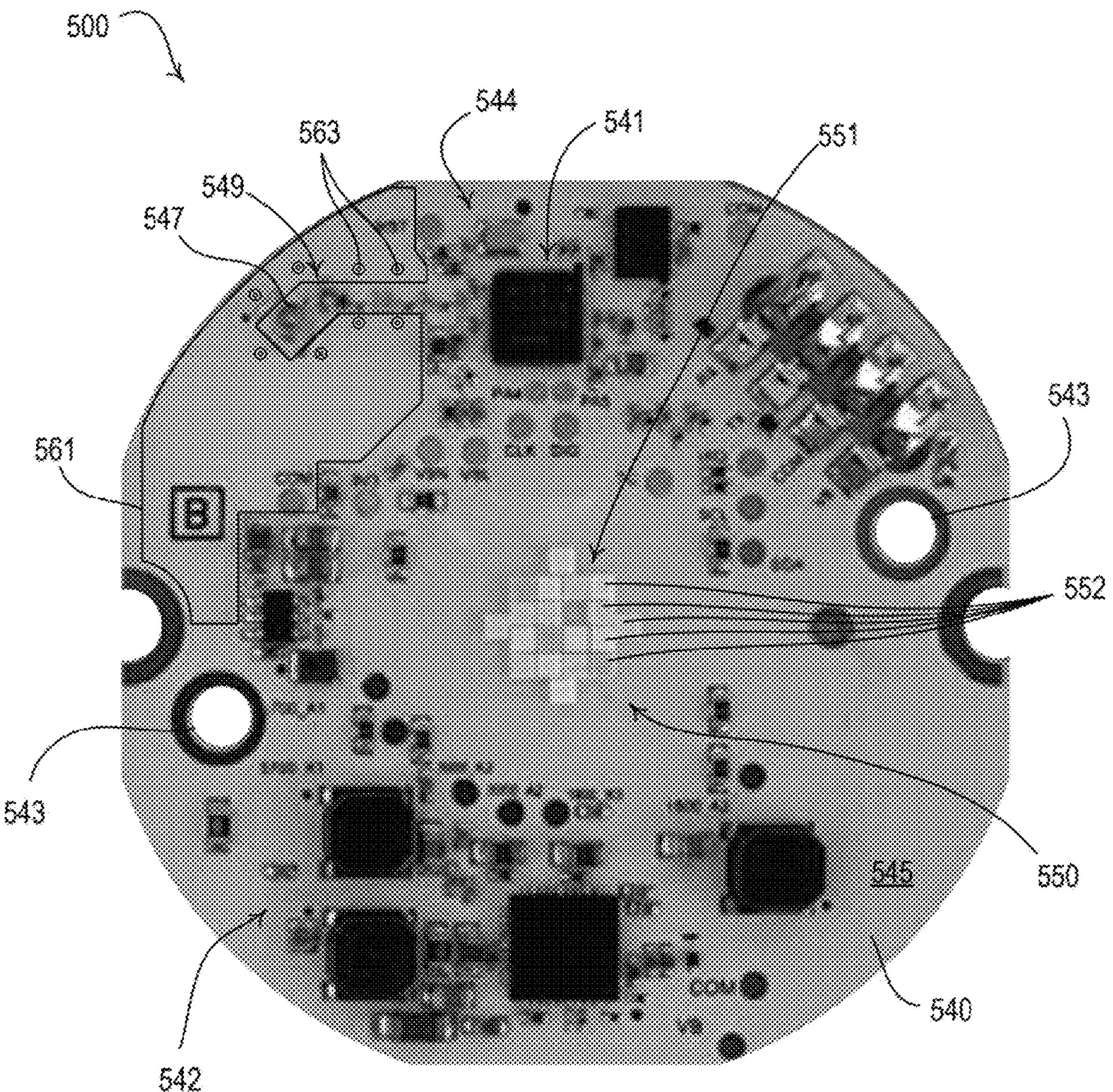
FIG. 10 is a top view of another example printed circuit board assembly.

FIG. 10 is a top view of another example printed circuit board assembly 500, which may be deployed as the printed circuit board assembly 232 of the light-generation module 230 shown in FIGS. 2 and 3. The printed circuit board assembly 500 may comprise a printed circuit board 540 (e.g., a single printed circuit board) and an emitter assembly 550 (e.g., the emitter assembly 250) having an arrangement 551 (e.g., an array) of emitters 552 (e.g., LEDs). The arrangement 551 of the emitters 552 may be located at a center of (e.g., substantially center of) the printed circuit board 540. For example, the emitter assembly 550 may comprise nineteen emitters 552 (e.g., as shown in FIG. 10), although other variations are possible. In some examples, the emitter assembly 550 may include more or less emitters 552 than shown in FIG. 10. In addition, different configurations of the emitters 552 may be used. The emitters 552 may be mounted to (e.g., directly mounted to) the printed circuit board 540.

The emitter assembly 550 may include multiple "chains" of the emitters 552 (e.g., series-coupled emitters). The emitters 552 of each respective chain may be coupled in series and may conduct the same drive current. Each respective chain may include emitters 552 that produce illumination at the same peak emission wavelength (e.g., emit light of the same color). The emitters 552 of different chains may emit light of different colors. For example, the emitter assembly 550 may comprise three differently-colored chains of emitters 552 (e.g., a warm-white color, a cool-white color, and/or a mint green color). The emitter assembly 550 may include a chain of warm-white emitters, a chain of cool-white emitters, and a chain of mint green emitters, with each chain not necessarily having the same number of LEDs. The individual emitters 552 in each chain may be scattered about the emitter assembly 550 (e.g., intermixed among the emitters 552 of the other chains of emitters 552), and arranged to improve color mixing within the emitter assembly 550. For example, the emitters may be configured to occupy an area of about 18 to 20 mm squared. Other variations of numbers of the emitters 552 per chain, the colors of the emitters 552, the numbers of the colors of the emitters 552, the number of chains of the emitters 552, the pattern of the arrangement 551 of the emitters 552, etc., may be used. For example, the emitter assembly 550 may comprise three differently-colored chains of emitters 552, with each respective chain having nine or fewer LEDs. According to one example, the printed circuit board assembly 500 may be configured as a warm dimming and white tuning module that produces light in the CCT range of 1800K to 5500K, for example, for CCT control. The printed circuit board assembly 500 may be further configured to provide at least 1100 Lumens at 18 W of power, for example.

As shown in FIG. 10, the emitter assembly 550 may not comprise any detectors (e.g., such as the detectors 254, 354, 454). However, in some examples, the emitter assembly 550 may include one or more detectors, which may be located next to the arrangement 551 of the emitters 552.

As shown in FIG. 10, the emitter assembly 550 may not include an optical element, such as a dome (e.g., the dome 256, 356, 456). However, in some examples, the emitter assembly 550 may include a dome that is configured to enclose (e.g., encapsulate) the emitters 552 and any detectors that are mounted to the printed circuit board 540 and may function in a similar manner as the domes 256, 356, 456. The dome may be formed on the printed circuit board 540 (e.g., via a procedure similar to the assembly procedure for forming the dome 256 as shown in FIGS. 6A-6E).

The printed circuit board assembly 500 may comprise drive circuitry 542 that may be mounted to the printed circuit board 540 (e.g., to a front side 545 of the printed circuit board 540). The drive circuitry 542 may control the amount of power delivered to the emitters 552 of the emitter assembly 550. For example, the drive circuitry 542 mounted to the printed circuit board 540 may include a plurality of electrical components, such as one or more drive circuits for controlling the emitters 552 and one or more control circuits for controlling the drive circuits. The drive circuitry 542 (e.g., the one or more control circuits) may be configured to control the emitters 552 of the emitter assembly 550 and to thus adjust an intensity level and/or a color of a cumulative light emitted by the light-generation module. For example, the drive circuitry 542 may be configured to control the emitters 552 to adjust the intensity level of the cumulative light emitted by the light-generation module 530 between a high-end intensity level (e.g., a maximum intensity level, such as approximately 100%) and a low-end intensity level (e.g., a minimum intensity level, such as approximately 0.1%-1.0%). In addition, the drive circuitry 542 may be configured to control the emitters 552 to adjust a present color temperature (e.g., a correlated color temperature (CCT) of the cumulative light emitted by the light-generation module. Further, the drive circuitry 542 may be configured to control the emitters 552 to adjust a present color value (e.g., which may be defined by a present x-chromaticity coordinate $X_{PRES}$ and a present y-chromaticity coordinate) of the cumulative light emitted by the light-generation module. While the printed circuit board assembly 500 is described herein with the present color value defined by the present x-chromaticity coordinate and the present y-chromaticity coordinate, the present color value could be defined by other color values (e.g., as defined in other color spaces). For example, the present color value by be a red-green-blue (RGB) color value (e.g., as defined by a red value, a green value, and a blue value, and/or a hex value in the RGB color space) a UVW color value (e.g., as defined by a u-chromaticity value, a v-chromaticity value, and a lightness index (e.g., w) value in the UVW color space), a wavelength, and/or other suitable color value.

The printed circuit board assembly 500 may also comprise communication circuitry 544 that may be mounted to the printed circuit board 540 (e.g., to the front side 545) and may be configured to communicate messages via signals (e.g., RF wireless signals) with devices external to/separate from the printed circuit board assembly 500. For example, the communication circuitry 544 may include a plurality of electrical components, such as one or more wireless communication circuits for communicating the messages via wireless signals, and one or more control circuits for interfacing between the wireless communication circuits and the drive circuitry 542. The communication circuitry 544 may comprise, for example, a processor 541 mounted to the front side 545 of the printed circuit board 540. The processor 541 may comprise, for example, a microprocessor, a microcontroller, a programmable logic device (PLD), an application specific integrated circuit (ASIC), a field-programmable gate array (FPGA), or any other suitable processing device or controller. The communication circuitry 544 (e.g., the processor 541) may be configured to cause the drive circuitry 542 (e.g., directly or indirectly via the one or more control circuits) to control (e.g., directly or indirectly) the emitters 552 of the emitter assembly 550 in response to messages received via the wireless signals.

The emitters 552 of the emitter assembly 550 may be thermally coupled to a heat sink of the light-generation module (e.g., the heat sink 234) via the printed circuit board 540, such that the heat sink is configured to dissipate heat generated by the emitters 552 of the emitter assembly 550. For example, the printed circuit board 540 may comprise a metal-core printed circuit board, which may provide for higher thermal conductivity and lower thermal resistance between the emitters 552 and the heat sink (e.g., as compared to a printed circuit board made from a more standard substrate, such as an FR4 substrate). The printed circuit board 540 may be attached to the heat sink and/or a socket (e.g., the socket 236) of the light-generation module via one or more fasteners (e.g., such as the fasteners 235) received through openings 543 in the printed circuit board 540 and corresponding openings in the heat sink and/or the socket. For example, the fasteners may comprise screws and/or rivets. The heat sink may be made of aluminum, although steel, copper, or other metals may be used. In some examples, the heat sink may be approximately 0.25 inches thick, although other thicknesses may be used.

While not shown in FIG. 10, the printed circuit board 540 may comprise a base layer (e.g., the base layer 260), an electrical layout layer (e.g., the electrical layout layer 262), a dielectric layer (e.g., the dielectric layer 264), and a solder mask layer (e.g., the solder mask layer 266), for example, in a similar configuration as the layers of the printed circuit board 240 shown in FIG. 5. The base layer may be a thermally-conductive substrate, such as copper, aluminum, or alumina, ceramic, or combinations thereof. The base layer may have a thickness of 1 mm (e.g., although other thicknesses may be used). The base layer may be physically and/or thermally connected to the heat sink, such as through a thermal grease. Since the presence of the dielectric layer may increase the thermal resistance (e.g., decrease the thermal conductivity) between the emitters 552 and the heat sink, a thickness of the dielectric layer of the printed circuit board 540 may be decreased to decrease the thermal resistance between the emitters 552 and the heat sink. In addition, the printed circuit board 540 may comprises (e.g., only comprise) a single dielectric layer (e.g., to further decrease the thermal resistance between the emitters 552 and the heat sink), and thus a single (e.g., only a single) electrical layout layer (e.g., the printed circuit board 540 may be a "single-layer" printed circuit board having all electrical traces and electrical pads on a single electrical layout layer). According to one example, the dielectric layer may be 50 um thick (e.g., or approximately 50 um thick (e.g., although other thicknesses may be used such as 50-150 μm thick)) and/or made of a dielectric material that has a stand-off approximately 100V and a high thermal conductivity (e.g., greater than 3 W/m/K). For example, the dielectric layer may be made of an organic resin with ceramic fillers (e.g., $Al_2O_3$, AlN, BN) to enhance thermal conductivity. When the printed circuit board 540 is installed in a light-generation module, the base layer of the printed circuit board 540 may be in contact (e.g., direct contact) with the heat sink (e.g., in a similar manner as the printed circuit board 240 contacts the heat sink 234 as shown in FIG. 5). According to this example, the printed circuit board 540 may be shaped as a disc, as shown, with a diameter of 2 inches (e.g., or approximately 2 inches), although other sizes may be used.

The drive circuitry 542, the communication circuitry 544, and the emitters 552 of the emitter assembly 550 mounted to the printed circuit board 540 may be electrically connected to the electrical traces and/or electrical pads of the electrical layout layer using an electrical connection technology, such as soldering technology (e.g., all of the drive circuitry 542, the communication circuitry 544, and the emitters 552 of the emitter assembly 550 may be electrically connected to the electrical traces and/or electrical pads of the electrical layout layer using the same electrical connection technology). For example, the electrical components of the drive circuitry 542, the communication circuitry 544, and the emitters 552 of the emitter assembly 550 may comprise SMT packages, and may be electrically and mechanically coupled to the electrical pads of the electrical layout layer via solder connections. The solder connections may be made using, for example, an SMT soldering process, such as, a reflow soldering process. According to other variations, two electrical connection technologies may be used as described herein. For example, the drive circuitry 542 and the communication circuitry 544 mounted to the printed circuit board 540 may be electrically connected to the electrical traces and/or electrical pads of the electrical layout layer using the first electrical connection technology (e.g., soldering technology), while the emitters 452 (e.g., may be electrically connected to the electrical traces and/or electrical pads of the electrical layout layer using a second electrical connection technology (e.g., wire-bonding technology).

Since the printed circuit board 540 is a "single-layer" printed circuit board, the layout of the electrical traces and electrical pads of the electrical layout layer of the printed circuit board 540 may be complex. For example, some electrical traces may run under electrical components mounted to the printed circuit board 540 (e.g., between the electrical pads to which the respective electrical component is mounted). In some examples, when two electrical traces may need to cross each other without being electrically connected to each other, a jumper (e.g., having a resistance of approximately zero ohms) may be included in series with one of the electrical traces such that the second electrical trace may be routed underneath the jumper. For example, a magnitude of current conducted through the electrical trace in series with the jumper may be less than a magnitude of current conducted through the electrical trace that is routed underneath of the jumper. In some examples, a jumper of a larger size may be used such that a plurality of electrical traces may be routed underneath the jumper. In other and/or additional examples, the electrical trace(s) that are routed underneath of the jumper may conduct static signals (e.g., a supply voltage rail, a circuit common, etc.), while the electrical trace in series with the jumper may conduct signals of higher frequency than the static signals.

Since the communication circuitry 544 is sensitive to noise that may be generated by other signals on the printed circuit board 540 (e.g., signals generated by the drive circuitry 542), the drive circuitry 542 may be mounted to the opposite side of the printed circuit board 540 as the communication circuitry 544 (e.g., to prevent cross-talk between the communication circuitry 544 and the rest of the circuitry on the printed circuit board 540 (e.g., the drive circuitry 542 and/or the emitter assembly 550). For example, assuming the printed circuit board 540 is bisected down the middle, through the emitter assembly 550, into two halves (e.g., two half circles), the communication circuitry 544 may be positioned on one half and the drive circuitry 542 positioned on the other opposing half. Further, communication circuitry 544 and the drive circuitry 542 may be positioned towards the perimeter edge of the printed circuit board 540 of their respective halves. While the thickness of the dielectric layer of the printed circuit board 540 may be minimized to decrease the thermal impedance between the emitters 552 and the heat sink (e.g., as previously mentioned), decreasing the thickness of the dielectric layer may also increase capacitance between the electrical layout layer and the base layer. This may lead to increased capacitance at the nodes of the communication circuitry 544, which may be detrimental to operation of the communication circuitry 544. Accordingly, the thickness of the dielectric layer may be minimized to decrease the thermal impedance between the emitters 552 and the heat sink, but not to a value that results in poor operation of the communication circuitry 544. For example, the thickness of the dielectric layer may be approximately 50-150 μm, which may provide a balance between heat dissipation and communication interference (e.g., when communicating at 2.4 MHz).The printed circuit board assembly 500 may also comprise an antenna (not shown) for communicating messages via wireless signals. The one or more wireless communication circuits of the communication circuitry 544 mounted to the printed circuit board 540 may be electrically coupled to the antenna for transmitting and/or receiving messages via the wireless signals from/to the external devices. Since the printed circuit board 540 is a metal-core printed circuit board, the antenna may not be formed on the single electrical layout layer of the printed circuit board 540 (e.g., since such an antenna would not be able to generate the RF signals through the base layer of the metal-core printed circuit board). Accordingly, the antenna may extend from the printed circuit board 540 (e.g., extend from the electrical layout layer of the printed circuit board 540). The antenna may be electrically and mechanically connected to an antenna connector 547 mounted to the printed circuit board 540 (e.g., to the front side 545). In addition and/or alternatively, the antenna may be soldered to a through-hole (e.g., not shown, although could be similar to the through-hole 347) and/or to a pad of the single electrical layout layer. For example, the antenna may comprise a monopole antenna that extends from the printed circuit board 540 (e.g., such as the antenna 246 shown in FIGS. 2 and 3). The antenna may be held in place in a position that extends from the printed circuit board 540 by an antenna holder (e.g., the antenna holder 248). In some examples, the antenna may be tuned to 2.4 MHz.

The communication circuitry 544 mounted to the printed circuit board 540 may comprise a matching network circuit 549. The matching network circuit 549 may be electrically coupled between the antenna (e.g., the antenna connector 547) and the processor 541. For example, the matching network circuit 549 may be configured to match an impedance of the antenna to an impedance of the communication circuitry 544 (e.g., the electrical components of the communication circuitry 544 not including the matching network circuit 549) to obtain a maximum transfer of power between the antenna and the communication circuitry 544 (e.g., to optimize the performance of the antenna and the communication circuitry 544). The matching network circuit 549 may include, for example, a multi-stage inductor-capacitor (LC) filter circuit. The antenna connector 547 and the matching network circuit 549 may be surrounded (e.g., at least partially surrounded) by a ground plane 561 on the electrical layout layer of the printed circuit board 540. The ground plane 561 may extend across an area on the front side 545 of the printed circuit board 540. The ground plane 561 may be electrically coupled to circuit common of the communication circuitry 544.

The ground plane 561 may also be electrically coupled to the base layer of the printed circuit board 540 (e.g., in addition to the ground plane 561 being electrically coupled to circuit common of the communication circuitry 544). In some examples, the ground plane 561 may be electrically coupled to the base layer of the printed circuit board 540 through one or more vias 563. The one or more vias 563 of the printed circuit board 540 may be located within the area of the ground plane 561 surrounding the antenna connector 547 and the matching network circuit 549. The one or more vias 563 may each comprise a hole drilled into the printed circuit board 540 (e.g., extending from the front side 545, through the solder mask layer, the electrical layout layer, the dielectric layer, and into the base layer). In some examples, one or more of the vias 563 may not extend entirely through the printed circuit board 540. The vias 563 may be filled with and/or lined with an electrically-conductive material, such as a silver epoxy material, and may operate to electrically connect the ground plane 561 on the electrical layout layer and the base layer. In addition and/or alternatively, the ground plane 561 may be electrically coupled to the base layer of the printed circuit board 540 through other electrical connections (e.g., rather than through the vias 563). The ground plane 561 may be electrically coupled to the base layer of the printed circuit board 540 through, for example, the fasteners (e.g., screws and/or rivets) received through the openings 543. For example, the openings 543 may be plated and/or coated with an electrically-conductive material. In some examples, the matching network circuit 549 may be connected to circuit common, and circuit common may be connected to the metal core/base layer (e.g., which may cause the metal core/base layer to also act as a ground plane).

According to a further example, the printed circuit board assembly 500 may be configured as two circuit boards, for example, as described with respect to the printed circuit board assembly 300.

Figure 11:
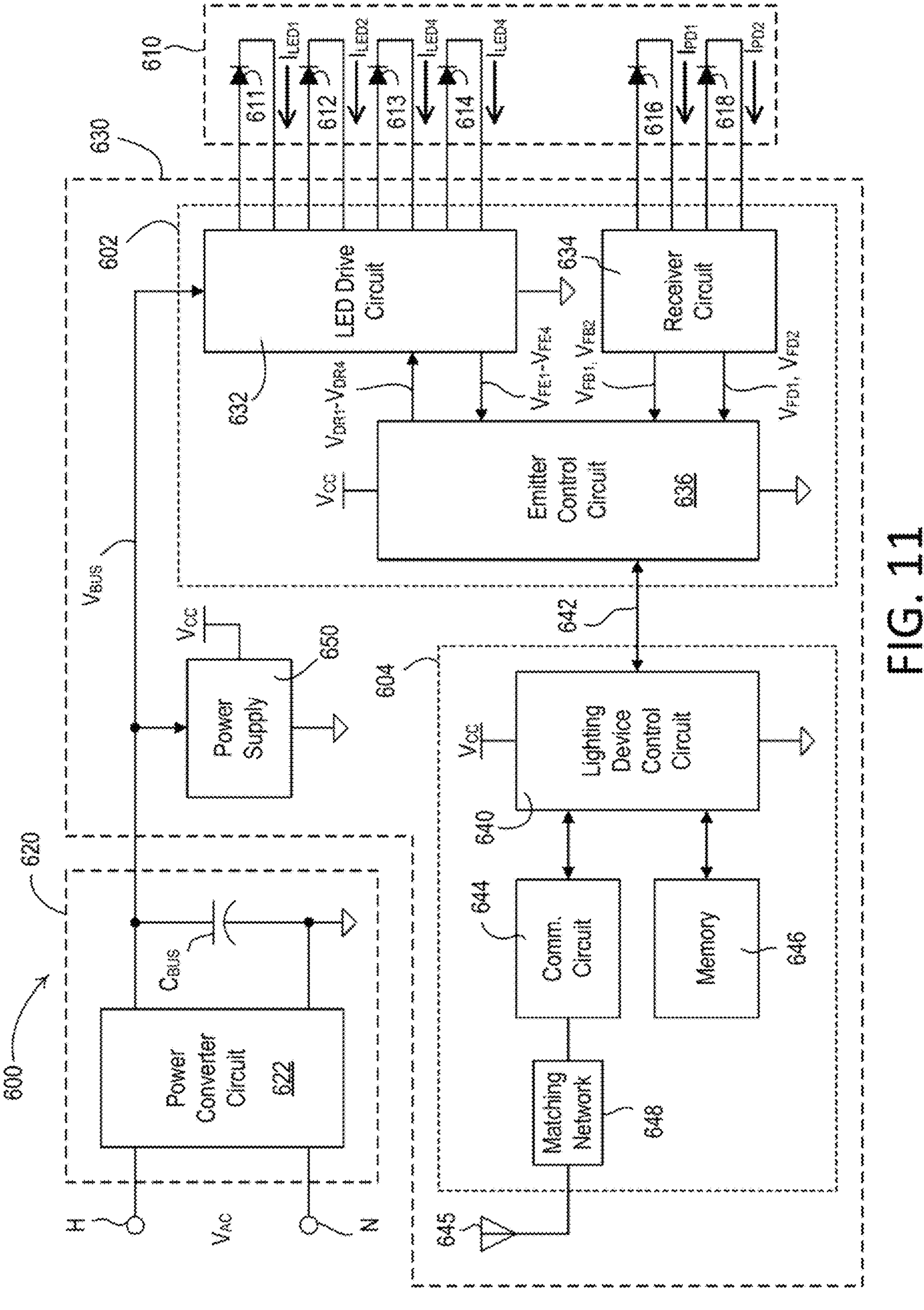
FIG. 11 is a simplified block diagram of an example lighting device, such as the lighting device shown in FIG. 1.

FIG. 11 is a simplified block diagram of an example lighting device 600, such as a controllable lighting device (e.g., the lighting device 100 shown in FIG. 1). The lighting device 600 may comprise one or more emitter assemblies 610 (e.g., the emitter assembly 250 shown in FIGS. 3-5, the emitter assembly 350 shown in FIGS. 7-8, the emitter assembly 450 shown in FIG. 9, and/or the emitter assembly 550 shown in FIG. 10). For example, the lighting device 600 may comprise an emitter assembly 610 that may include one or more emitters 611, 612, 613, 614 (e.g., four emitters as shown in FIG. 11). In some example, the emitter assembly 610 may comprise more or less emitters (e.g., such as three emitters as with the emitter assembly 550 shown in FIG. 10). Each of the emitters 611, 612, 613, 614 is shown in FIG. 11 as a single LED, but each may comprise a plurality of LEDs connected in series (e.g., a chain of LEDs), a plurality of LEDs connected in parallel, or a suitable combination thereof, depending on the particular lighting system. In addition, each of the emitters 611, 612, 613, 614 may comprise one or more organic light-emitting diodes (OLEDs). For example, the first emitter 611 may represent a chain (e.g., one or more) of red LEDs, the second emitter 612 may represent a chain (e.g., one or more) of blue LEDs, the third emitter 613 may represent a chain (e.g., one or more) of green LEDs, and the fourth emitter 614 may represent a chain (e.g., one or more) of white or amber or mint green LEDs. Each respective emitter 611, 612, 613, 614, may comprise a different number of LEDs or OLEDS, for example, than the other emitters. As another example, two or more of the emitters contain the same color LEDS/OLEDs (e.g., multiple chains of red LEDs). As another example, a given emitter may contain a chain of LEDs/OLEDs of mixed colors. The emitters 611, 612, 613, 614 may be controlled to adjust a brightness (e.g., a luminous flux or an intensity) and/or a color (e.g., a color temperature) of a cumulative light output of the lighting device 600. The emitter assembly 610 may also comprise one or more detectors 616, 618 (e.g., photodiodes) that may produce respective photodiode currents $I_{PD1}$, $I_{PD2}$ (e.g., detector signals) in response to incident light. For example, the first detector 616 may represent a single red, orange or yellow LED or multiple red, orange or yellow LEDs in parallel (e.g., the first detectors 316 of the emitter assembly 350 and/or the first detectors 416 of the emitter assembly 450), and the second detector 618 may represent a single green LED or multiple green LEDs in parallel (e.g., the second detectors 318 of the emitter assembly 350 and/or the second detectors 418 of the emitter assembly 450). The emitter assembly 610 may be mounted on a printed circuit board of a lighting device assembly of the lighting device 600 (e.g., the printed circuit board 240 of the light-generation module 230 of the lighting device assembly 200, the printed circuit board 440 of the printed circuit board assembly 400, and/or the printed circuit board 540 of the printed circuit board assembly 500).

The lighting device 600 may comprise a power conversion stage 620. The power conversion stage 620 may comprise a power converter circuit 622, which may receive a source voltage, such as an AC mains line voltage $V_{AC}$, via a hot connection H and a neutral connection N. The power converter circuit 622 may generate a DC bus voltage $V_{BUS}$ (e.g., approximately 15-20V) across a bus capacitor $C_{BUS}$. The power converter circuit 622 may comprise, for example, a boost converter, a buck converter, a buck-boost converter, a flyback converter, a single-ended primary-inductance converter (SEPIC), a Ćuk converter, or any other suitable power converter circuit for generating an appropriate bus voltage. The power converter circuit 622 may provide electrical isolation between the AC power source and the emitters 611, 612, 613, 614, and may operate as a power factor correction (PFC) circuit to adjust the power factor of the lighting device 600 towards a power factor of one. The circuitry of the power conversion stage 620 may be mounted to a power printed circuit board that is external to the lighting device assembly that includes the printed circuit board to which the emitter assembly 610 is mounted.

The lighting device 600 may comprise a light-generation module stage 630. The light-generation module stage 630 may include drive circuitry 602 (e.g., the drive circuitry 242, 342, 442, 542) and communication circuitry 604 (e.g., the communication circuitry 244, 344, 444, 544). For example, the drive circuitry 602 and the communication circuitry 604 of the light-generation module stage 630 may be mounted to the printed circuit board to which the emitter assembly 610 is also mounted (e.g., the printed circuit board 240 of the light-generation module 230 of the lighting device assembly 200, the printed circuit board 440 of the printed circuit board assembly 400, and/or the printed circuit board 540 of the printed circuit board assembly 500). In some examples, the drive circuitry 602 may be mounted to a first printed circuit board to which the emitter assembly 610 is also mounted (e.g., the first printed circuit board 340 of the printed circuit board assembly 300) and the communication circuitry 604 may be mounted to a second printed circuit board (e.g., the second printed circuit board 341 of the printed circuit board assembly 300).

The drive circuitry 602 may comprise an LED drive circuit 632, a receiver circuit 634, and an emitter control circuit 636. The LED drive circuit 632 may be configured to control (e.g., individually control) the power delivered to and the luminous flux of the light emitted of each of the emitters 611, 612, 613, 614 of the emitter assembly 610. The LED drive circuit 632 may receive the bus voltage $V_{BUS}$ and may adjust magnitudes of respective LED drive currents $I_{LED1}$, $I_{LED2}$, $I_{LED3}$, $I_{LED4}$ conducted through the emitters 611, 612, 613, 614. The LED drive circuit 632 may comprise one or more regulation circuits (e.g., four regulation circuits), such as switching regulators (e.g., buck converters) for controlling the magnitudes of the respective LED drive currents $I_{LED1}$-$I_{LED4}$. An example of the LED drive circuit 632 is described in greater detail in U.S. Pat. No. 9,485,813, issued Nov. 1, 2016, entitled ILLUMINATION DEVICE AND METHOD FOR AVOIDING AN OVER-POWER OR OVER-CURRENT CONDITION IN A POWER CONVERTER, the entire disclosure of which is hereby incorporated by reference.

The receiver circuit 634 may be electrically coupled to the detectors 616, 618 of the emitter assembly 610 for generating respective optical feedback signals $V_{FB1}$, $V_{FB2}$ in response to the photodiode currents $I_{PD1}$, $I_{PD2}$. The receiver circuit 634 may comprise one or more trans-impedance amplifiers (e.g., two trans-impedance amplifiers) for converting the respective photodiode currents $I_{PD1}$, $I_{PD2}$ into the optical feedback signals $V_{FB1}$, $V_{FB2}$. For example, the optical feedback signals $V_{FB1}$, $V_{FB2}$ may have DC magnitudes that indicate the magnitudes of the respective photodiode currents $I_{PD1}$, $I_{PD2}$.

The emitter control circuit 636 may be configured to control the LED drive circuit 632 to control the intensities of the emitters 611, 612, 613, 614 of the emitter assembly 610. The emitter control circuit 636 may comprise, for example, a microprocessor, a microcontroller, a programmable logic device (PLD), an application specific integrated circuit (ASIC), a field-programmable gate array (FPGA), or any other suitable processing device or controller. The emitter control circuit 636 may generate one or more drive signals $V_{DR1}$, $V_{DR2}$, $V_{DR3}$, $V_{DR4}$ for controlling the respective regulation circuits in the LED drive circuit 632. The emitter control circuit 636 may receive the optical feedback signals $V_{FB1}$, $V_{FB2}$ from the receiver circuit 634 for determining the luminous flux $L_E$ of the light emitted by the emitters 611, 612, 613, 614.

The emitter control circuit 636 may receive a plurality of emitter forward-voltage feedback signals $V_{FE1}$, $V_{FE2}$, $V_{FE3}$, $V_{FE4}$ from the LED drive circuit 632 and a plurality of detector forward-voltage feedback signals $V_{FD1}$, $V_{FD2}$ from the receiver circuit 634. The emitter forward-voltage feedback signals $V_{FE1}$-$V_{FE4}$ may be representative of the magnitudes of the forward voltages of the respective emitters 611, 612, 613, 614, which may indicate temperatures $T_{E1}$, $T_{E2}$, $T_{E3}$, $T_{E4}$ of the respective emitters. If each emitter 611, 612, 613, 614 comprises multiple LEDs electrically coupled in series, the emitter forward-voltage feedback signals $V_{FE1}$-$V_{FE4}$ may be representative of the magnitude of the forward voltage across a single one of the LEDs or the cumulative forward voltage developed across multiple LEDs in the chain (e.g., all of the series-coupled LEDs in the chain). The detector forward-voltage feedback signals $V_{FD1}$, $V_{FD2}$ may be representative of the magnitudes of the forward voltages of the respective detectors 616, 618, which may indicate temperatures $T_{D1}$, $T_{D2}$ of the respective detectors. For example, the detector forward-voltage feedback signals $V_{FD1}$, $V_{FD2}$ may be equal to the forward voltages $V_{FD}$ of the respective detectors 616, 618.

The communication circuitry 604 may comprise a lighting device control circuit 640, a communication circuit 644, and a memory 646. The lighting device control circuit 640 may be electrically coupled to the emitter control circuit 636 via a communication bus 642 (e.g., an $I^2C$ communication bus). The lighting device control circuit 640 may be configured to control the emitter assembly 610 (e.g., via the emitter control circuit 636) to control the brightness (e.g., luminous flux) and/or the color (e.g., color temperature) of the cumulative light emitted by the lighting device 600. The lighting device control circuit 640 may comprise, for example, a microprocessor, a microcontroller, a programmable logic device (PLD), an application specific integrated circuit (ASIC), a field-programmable gate array (FPGA), or any other suitable processing device or controller. The lighting device control circuit 640 may be configured to adjust (e.g., dim) (e.g., via the emitter control circuit 636) a present intensity $L_{PRES}$ (e.g., a present brightness) of the cumulative light emitted by the lighting device 600 towards a target intensity $L_{TRGT}$ (e.g., a target brightness), which may range across a dimming range of the controllable lighting device, e.g., between a low-end intensity $L_{LE}$ (e.g., a minimum intensity, such as approximately 0.1%-1.0%) and a high-end intensity $L_{HE}$ (e.g., a maximum intensity, such as approximately 100%). The lighting device control circuit 640 may be configured to adjust (e.g., via the emitter control circuit 636) a present color temperature $T_{PRES}$ of the cumulative light emitted by the lighting device 600 towards a target color temperature $T_{TRGT}$, which may range between a cool-white color temperature (e.g., approximately 3100-4500 K) and a warm-white color temperature (e.g., approximately 2000-3000 K), although other temperature ranges are possible.

The communication circuit 644 may be coupled to the lighting device control circuit 640. The communication circuit 644 may comprise a communication circuit, such as, for example, a wireless communication circuit, such as a radio-frequency (RF) transceiver, coupled to an antenna 645 (e.g., the antenna 246) for transmitting and/or receiving RF signals. In addition, the communication circuit may be an RF transmitter for transmitting RF signals and an RF receiver for receiving RF signals. The communication circuitry 604 may also comprise a matching network circuit 648 (e.g., the matching network circuit 449, 549). The communication circuit 644 (e.g., the communication circuitry 604) may be configured to be in electrical communication with (e.g., electrically coupled to) the antenna 645 via the matching network circuit 648 (e.g., the matching network circuit 648 is electrically coupled between the communication circuit 644 of the communication circuitry 604 and the antenna 645). The matching network circuit 648 may be configured to optimize the performance of the communication circuit 644 and/or the antenna 645. For example, the matching network circuit 648 may be configured to match an impedance of the antenna 645 to an impedance of the communication circuit 644 (e.g., the electrical components of the communication circuit 644 not including the matching network circuit 648) to obtain a maximum transfer of power between the communication circuit 644 and the antenna 645. The matching network circuit 648 may include, for example, an inductor-capacitor matching network, such as an inductor-capacitor (LC) filter circuit. In some examples, the communication circuit 644 may be coupled to the hot connection H and the neutral connection N of the lighting device 600 for transmitting a control signal via the electrical wiring using, for example, a power-line carrier (PLC) communication technique. The lighting device control circuit 640 may be configured to determine the target intensity $L_{TRGT}$ for the lighting device 600 in response to messages (e.g., digital messages) received via the communication circuit 644.

The memory 646 may be configured to store operational characteristics of the lighting device 600 (e.g., the target intensity $L_{TRGT}$, the target color temperature $T_{TRGT}$, the low-end intensity $L_{LE}$, the high-end intensity $L_{HE}$, etc.). The memory 646 may be implemented as an external integrated circuit (IC) or as an internal circuit of the lighting device control circuit 640. The lighting device 600 may comprise a power supply 650 (e.g., that may be mounted on a printed circuit board of a lighting device assembly of the lighting device 600 (e.g., the printed circuit board 240 of the light-generation module 230 of the lighting device assembly 200, the printed circuit board 440 of the printed circuit board assembly 400, and/or the printed circuit board 540 of the printed circuit board assembly 500)) that may receive the bus voltage $V_{BUS}$ and generate a supply voltage $V_{CC}$ for powering the lighting device control circuit 640 and other low-voltage circuitry of the lighting device.

When the lighting device 600 is on, the lighting device control circuit 640 may be configured to control the emitter assembly 610 (e.g., via the emitter control circuit 636) to emit light substantially all of the time. The lighting device control circuit 640 may be configured to control the emitter assembly 610 to disrupt the normal emission of light to measure one or more operational characteristics of the emitter assemblies during periodic measurement intervals. For example, during the measurement intervals, the emitter control circuit 636 may be configured to individually turn on each of the different-colored emitters 611, 612, 613, 614 of the emitter assembly 610 (e.g., while turning off the other emitters) and measure the luminous flux of the light emitted by that emitter using one of the two detectors 616, 618. For example, the emitter control circuit 636 may turn on the first emitter 611 of the emitter assembly 610 (e.g., at the same time as turning off the other emitters 612, 613, 614 and determine the luminous flux $L_E$ of the light emitted by the first emitter 611 in response to the first optical feedback signal $V_{FB1}$ generated from the first detector 616. In addition, the emitter control circuit 636 may be configured to drive the emitters 611, 612, 613, 614 and the detectors 616, 618 to generate the emitter forward-voltage feedback signals $V_{FE1}$-$V_{FE4}$ and the detector forward-voltage feedback signals $V_{FD1}$, $V_{FD2}$ during the measurement intervals.

Calibration values for the various operational characteristics of the lighting device 600 may be stored in the memory 646 as part of a calibration procedure performed during manufacturing of the lighting device 600, for example. Calibration values may be stored for each of the emitters 611, 612, 613, 614 and/or the detectors 616, 618 of the emitter assembly 610. For example, calibration values may be stored for measured values of luminous flux (e.g., in lumens), x-chromaticity, y-chromaticity, emitter forward voltage, photodiode current, and detector forward voltage. For example, the luminous flux, x-chromaticity, and y-chromaticity measurements may be obtained from the emitters 611, 612, 613, 614 using an external calibration tool, such as a spectrophotometer. The values for the emitter forward voltages, photodiode currents, and detector forward voltages may be measured internally to the lighting device 600. The calibration values for each of the emitters 611, 612, 613, 614 and/or the detectors 616, 618 may be measured at a plurality of different drive currents, and/or at a plurality of different operating temperatures.

After installation, the lighting device control circuit 640 of the lighting device 600 may use the calibration values stored in the memory 646 to maintain a constant light output from the emitter assembly 610. The lighting device control circuit 640 may determine target values for the luminous flux to be emitted from the emitters 611, 612, 613, 614 to achieve the target intensity $L_{TRGT}$ and/or the target color temperature $T_{TRGT}$ for the lighting device 600. The lighting device control circuit 640 may determine the magnitudes for the respective drive currents $I_{LED1}$-$I_{LED4}$. for the emitters 611, 612, 613, 614 based on the determined target values for the luminous flux to be emitted from the emitters 611, 612, 613, 614. When the age of the lighting device 600 is zero, the magnitudes of the respective drive currents $I_{LED1}$-$I_{LED4}$ for the emitters 611, 612, 613, 614 may be controlled to initial magnitudes $I_{LED-INITIAL}$.

What is claimed is:

1. A printed circuit board assembly comprising:

a metal-core printed circuit board comprising a base layer, a single electrical layout layer, and a single dielectric layer located between the base layer and the electrical layout layer, the electrical layout layer comprising a plurality of electrical pads, a plurality of electrical traces, and a ground plane;

an emitter assembly comprising a plurality of emitters configured to emit light, the plurality of emitters mounted to the printed circuit board and electrically connected to two or more of the plurality of electrical pads;

drive circuitry configured to control power delivered to the plurality of emitters of the emitter assembly, the drive circuitry mounted to the printed circuit board and electrically connected to the two or more of the plurality of electrical pads;

communication circuitry configured to transmit and receive wireless signals, the communication circuitry comprising a circuit common electrically coupled to the ground plane of the printed circuit board, the communication circuitry configured to cause the drive circuitry to control the emitters in response to messages received via the wireless signals, the communication circuitry mounted to the printed circuit board and electrically connected to the two or more of the plurality of electrical pads; and an antenna coupled in electrical communication with the communication circuitry for allowing the communication circuitry to communicate messages via the wireless signals that are transmitted and received by the antenna, the antenna extending from the printed circuit board;

wherein the communication circuitry further comprises a matching network circuit coupled between the communication circuitry and the antenna, the matching network circuit at least partially surrounded by the ground plane on the electrical layout layer, the ground plane electrically coupled to the base layer of the printed circuit board.

2. The printed circuit board assembly of claim 1, wherein the plurality of emitters are electrically connected to the two or more of the plurality of electrical pads via respective wind bonds, and the drive circuitry and the communication circuitry are electrically connected to the two or more of the plurality of electrical pads via respective solder connections.

3. The printed circuit board assembly of claim 2, wherein the emitters of the emitter assembly are encapsulated by an optical element.

4. The printed circuit board assembly of claim 3, wherein the optical element comprises:

a first dome portion formed on the printed circuit board and encapsulating the one or more emitters, the first dome portion made of a first material that is optically transmissive, the first dome portion defining an interface surface that is substantially parallel to and extends above the printed circuit board; and a second dome portion located above the first dome portion, such that the first dome portion is located between the second dome portion and the printed circuit board, the second dome portion having a shape configured to direct light from the one or more emitters in a particular direction, the second dome portion made of a second material that is optically transmissive and defining an interface surface that is adhered to the interface surface of the first dome portion.

5. The printed circuit board assembly of claim 4, wherein the optical element further comprises a barrier located on a surface of the metal-core printed circuit board and surrounding the one or more emitters, the barrier and the surface of the metal-core printed circuit board defining a recess in which the first dome portion is located.

6. The printed circuit board assembly of claim 3, wherein the optical element comprises a dome through which the emitters are configured to emit light.

7. The printed circuit board assembly of claim 1, wherein the antenna comprises a monopole antenna.

8. The printed circuit board assembly of claim 7, further comprising:

an antenna connector mounted to the printed circuit board;

wherein the monopole antenna is electrically connected to the antenna connector, such that the monopole antenna extends from the printed circuit board.

9. The printed circuit board assembly of claim 7, further comprising:

a through-hole extending through the printed circuit board;

wherein the monopole antenna is electrically connected to the through-hole, such that the monopole antenna extends from the printed circuit board.

10. The printed circuit board assembly of claim 1, wherein the printed circuit board comprises at least one opening that extends through the printed circuit board and is configured to receive a fastener, and wherein the ground plane on the electrical layout layer is electrically coupled to the base layer of the printed circuit board through the fastener.

11. The printed circuit board assembly of claim 10, wherein the fastener comprises at least one of a screw or a rivet.

12. The printed circuit board assembly of claim 1, wherein the printed circuit board comprises one or more vias located within the ground plane, each of the vias extending from the electrical layout layer, through the dielectric layer, and into the base layer, each of the vias filled with an electrically-conductive material for electrically connecting the ground plane on the electrical layout layer to the base layer.

13. A lighting device assembly comprising:

a printed circuit board assembly comprising:

a metal-core printed circuit board comprising a base layer, a single electrical layout layer, and a single dielectric layer located between the base layer and the electrical layout layer, the electrical layout layer comprising a plurality of electrical pads, a plurality of electrical traces, and a ground plane;

an emitter assembly comprising a plurality of emitters configured to emit light, the plurality of emitters mounted to the printed circuit board and electrically connected to two or more of the plurality of electrical pads;

drive circuitry configured to control power delivered to the plurality of emitters of the emitter assembly, the drive circuitry mounted to the printed circuit board and electrically connected to the two or more of the plurality of electrical pads; and communication circuitry configured to transmit and receive wireless signals, the communication circuitry configured to cause the drive circuitry to control the emitters in response to messages received via the wireless signals, the communication circuitry mounted to the printed circuit board and electrically connected to the two or more of the plurality of electrical pads, the communication circuitry comprising a circuit common electrically coupled to the ground plane of the printed circuit board; and a reflector that has a first opening, a second opening, and an inner surface that is reflective, the plurality of emitters configured to emit light through the first opening of the reflector, the inner surface of the reflector configured to reflect the light through the second opening of the reflector;

wherein the printed circuit board assembly further comprises an antenna coupled in electrical communication with the communication circuitry for allowing the communication circuitry to communicate messages via the wireless signals that are transmitted and received by the antenna, the antenna extending from the printed circuit board external to the reflector.

14. The lighting device assembly of claim 13, wherein the antenna comprises a monopole antenna.

15. The lighting device assembly of claim 14, further comprising:

an antenna holder for holding the monopole antenna such that the monopole antenna extends from the printed circuit board external to the reflector.

16. The lighting device assembly of claim 15, further comprising:

a socket to which the reflector is attached;

wherein the antenna holder is connected to the socket and extends from the socket external to the reflector.

17. The lighting device assembly of claim 15, wherein the antenna holder is connected to the printed circuit board of the printed circuit board assembly.

18. The lighting device assembly of claim 14, further comprising:

an antenna connector mounted to the printed circuit board;

wherein the monopole antenna is electrically connected to the antenna connector, such that the monopole antenna extends from the printed circuit board external to the reflector.

19. The lighting device assembly of claim 14, further comprising:

a through-hole extending through the printed circuit board;

wherein the monopole antenna is electrically connected to the through-hole, such that the monopole antenna extends from the printed circuit board external to the reflector.

20. The lighting device assembly of claim 13, wherein the ground plane is electrically coupled to the base layer of the printed circuit board of the printed circuit board assembly.

21. The lighting device assembly of claim 20, wherein the printed circuit board of the printed circuit board assembly comprises at least one opening that extends through the printed circuit board and is configured to receive a fastener, and wherein the ground plane on the electrical layout layer is electrically coupled to the base layer of the printed circuit board through the fastener.

22. The lighting device assembly of claim 21, wherein the fastener comprises at least one of a screw or a rivet.

23. The lighting device assembly of claim 20, wherein the printed circuit board of the printed circuit board assembly comprises one or more vias located within the ground plane, each of the vias extending from the electrical layout layer, through the dielectric layer, and into the base layer, each of the vias filled with an electrically-conductive material for electrically connecting the ground plane on the electrical layout layer to the base layer.

24. The lighting device assembly of claim 20, wherein the communication circuitry of the printed circuit board assembly further comprises a matching network circuit coupled between the communication circuitry and the antenna, the matching network circuit at least partially surrounded by the ground plane on the electrical layout layer.

25. The lighting device assembly of claim 13, wherein the plurality of emitters of the emitter assembly are electrically connected to the two or more of the plurality of electrical pads of the printed circuit board via respective wind bonds, and the drive circuitry and the communication circuitry are electrically connected to the two or more of the plurality of electrical pads of the printed circuit board via respective solder connections.

26. The lighting device assembly of claim 25, wherein the emitters of the emitter assembly are encapsulated by an optical element.

27. The lighting device assembly of claim 26, wherein the optical element of the emitter assembly of the printed circuit board assembly comprises:

a first dome portion formed on the printed circuit board and encapsulating the one or more emitters, the first dome portion made of a first material that is optically transmissive, the first dome portion defining an interface surface that is substantially parallel to and extends above the printed circuit board; and a second dome portion located above the first dome portion, such that the first dome portion is located between the second dome portion and the printed circuit board, the second dome portion having a shape configured to direct light from the one or more emitters in a particular direction, the second dome portion made of a second material that is optically transmissive and defining an interface surface that is adhered to the interface surface of the first dome portion.

28. The lighting device assembly of claim 27, wherein the optical element further comprises a barrier located on a surface of the metal-core printed circuit board and surrounding the one or more emitters, the barrier and the surface of the metal-core printed circuit board defining a recess in which the first dome portion is located.

29. The lighting device assembly of claim 26, wherein the optical element comprises a dome through which the emitters are configured to emit light.

* * * * *